United States Patent [19]
Irwin et al.

[11] Patent Number: 5,231,395
[45] Date of Patent: Jul. 27, 1993

[54] SIGMA-DELTA DIGITAL-TO-ANALOG CONVERTER WITH REDUCED DISTORTION

[75] Inventors: James S. Irwin, Paige; Robert C. Ledzius; Dhirajlal N. Manvar, both of Austin, all of Tex.

[73] Assignee: Motorola, Inc., Schaumburg, Ill.

[21] Appl. No.: 860,540

[22] Filed: Mar. 30, 1992

[51] Int. Cl.⁵ .................. H03M 3/00; H03M 1/06; H03M 1/82

[52] U.S. Cl. .................. 341/143; 341/118; 341/144; 341/152

[58] Field of Search .............. 341/143, 118, 144, 152; 375/27, 28

[56] References Cited

U.S. PATENT DOCUMENTS

| | | |
|---|---|---|
| 4,179,659 | 12/1979 | Tashiro .............. 341/143 X |
| 4,371,972 | 2/1983 | Schwarz et al. .......... 341/143 X |
| 4,897,856 | 1/1990 | Cukier et al. .......... 341/143 X |
| 5,028,925 | 7/1991 | Ferry et al. .............. 341/143 |
| 5,057,840 | 10/1991 | Ledzius et al. .......... 341/144 |

Primary Examiner—Sharon D. Logan
Attorney, Agent, or Firm—Maurice Jay Jones; Paul J. Polansky

[57] ABSTRACT

A sigma-delta digital-to-analog converter (20) reduces even order distortion, such as a DC offset, in an output signal by chopping the output signal alternately with set and reset pulses. The sigma-delta digital-to-analog converter (20) includes a sigma-delta modulator (25), a chop circuit (261) associated with a corresponding bit of the sigma-delta modulator (25), and an output buffer (264) for providing the output signal. The chop circuit (261) alternately inserts first and second logic levels into an output data stream of the sigma-delta modulator (25) before providing it to the output buffer (264). Even-order distortion is eliminated with only a tolerable attenuation of the output signal.

20 Claims, 14 Drawing Sheets

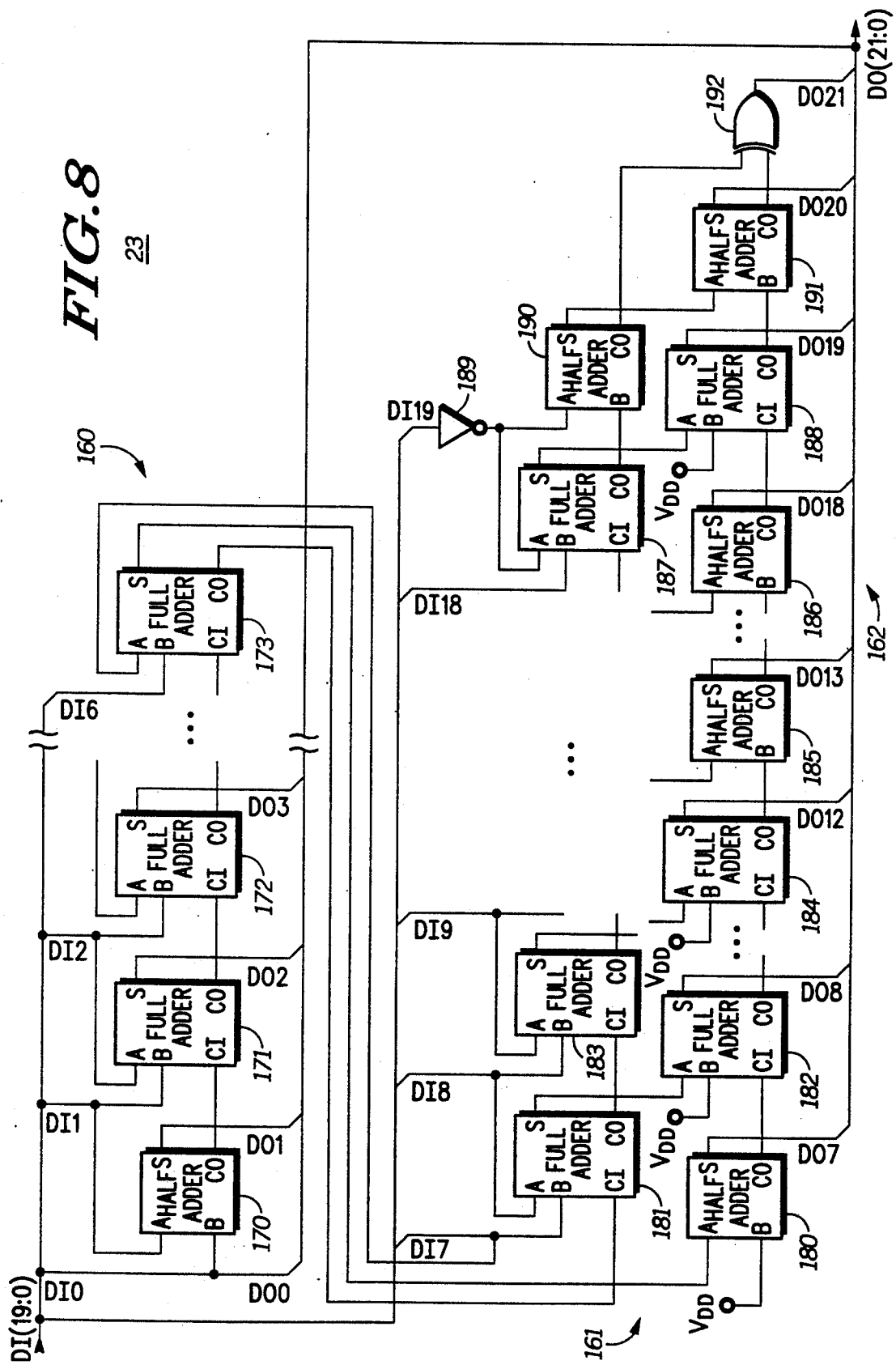

SIGMA-DELTA DIGITAL-TO-ANALOG CONVERTER WITH REDUCED DISTORTION

CROSS REFERENCE TO RELATED, COPENDING APPLICATIONS

Related, copending applications are: "Digital-to-Analog Converter with a Flexible Data Interface," Ser. No. 07/860,381, filed Mar. 30, 1992, by Robert C. Ledzius, James S. Irwin, and Dhirajlal N. Manvar, and assigned to the assignee hereof; "Digital-to-Analog Converter with Improved Performance and Method Therefor," Ser. No. 07/860,663, filed Mar. 30, 1992, by Robert C. Ledzius, James S. Irwin, and Dhirajlal N. Manvar, and assigned to the assignee hereof; and "Digital-to-Analog Converter with a Linear Interpolator," Ser. No. 07/860,622, filed Mar. 30, 1992, by Dhirajlal N. Manvar and Robert C. Ledzius and assigned to the assignee hereof.

FIELD OF THE INVENTION

This invention relates generally to digital-to-analog converters, and more particularly, to digital-to-analog converters using sigma-delta modulators.

BACKGROUND OF THE INVENTION

There are two basic techniques used in digital-to-analog converters (DACs). These are the sigma-delta technique and the resistive or capacitive divider techniques. The sigma-delta technique is attractive because it achieves high resolution by precise timing instead of precisely-matched on-chip components such as resistors. In addition, the expertise needed to produce thin-film, laser-trimmed analog components is difficult to obtain; whereas, high-speed digital switching capability is commonplace in the semiconductor industry.

A basic sigma-delta DAC receives a digital signal which is summed with inverse feedback of the analog output signal (after being reconverted to a digital signal) to provide an error signal. The error signal is then processed through an integrator and a comparator to provide the analog output signal. The analog signal is also processed through an analog-to-digital converter (ADC) to provide the feedback signal.

The digital output data stream of the sigma-delta modulator must be buffered before being provided externally. If a one-bit sigma-delta modulator is used, then the buffered output signal is the output signal of the DAC. If a multi-bit sigma-delta modulator is used, then each bit must be buffered and then weighted proportionally to its significance.

A problem arises in buffering these signals using conventional technology. The buffer includes a series of inverters, each having progressively larger transistors. For example, in CMOS technology, each inverter stage includes a P-channel transistor connected in series with an N-channel transistor between positive and negative power supply voltage terminals. Because the transfer characteristics of P-channel and N-channel transistors are somewhat different, each inverter stage produces a different delay on one transition than on the other transition. This characteristic produces even-order distortion. Since N-type silicon has a higher conductance than P-type silicon, the N-channel transistor will switch faster than a similarly-sized P-channel transistor. Thus, when presented with a square wave at its input, the inverter will provide an output that has longer low pulses than high pulses. This results in a negative DC offset providing even-order (an order of zero in a Fourier expansion) distortion. While it is possible to alter the sizes of the devices to compensate for the difference in the switching speeds, the compensation will be inexact as temperature, voltage, and processing parameters vary. Thus, the distortion remains.

One way to compensate for the even-order distortion problem is for the DAC to provide differential outputs. Then, the differential outputs can be processed through separate smoothing filters and provided as inputs to a differential amplifier, all located off-chip. Since the distortion occurs in opposite directions between the true and complement output signals, the differential amplifier is able to cancel them out. However, cancellation through use of differential outputs would require an extra smoothing filter for the negative signal. Furthermore, this cancellation is not perfect, and is limited to the matching of the components in the smoothing filter and the amplifier.

SUMMARY OF THE INVENTION

Accordingly, there is provided, in one form, a sigma-delta digital-to-analog converter with reduced distortion comprising a sigma-delta modulator, a chop circuit, and an output buffer. The sigma-delta modulator has an input for receiving a digital input signal, and an output for providing a modulator output signal at a rate of a clock signal. The modulator output signal has a duty cycle proportional to a magnitude of the digital input signal. The chop circuit is coupled to the sigma-delta modulator, receives the modulator output signal, and alternately inserts first and second logic levels into the modulator output signal to provide a chopped data signal. The output buffer has an input for receiving the chopped data signal, and an output for providing a buffered chopped data signal.

These and other features and advantages will be more clearly understood from the following detailed description taken in conjunction with the accompanying drawings.

BRIEF DESCRIPTION OF THE DRAWINGS

FIG. 8 illustrates in partial block diagram and partial logic diagram form the offset/scaler of FIGS. 1 and 7.

DETAILED DESCRIPTION OF THE INVENTION

Figure 1:
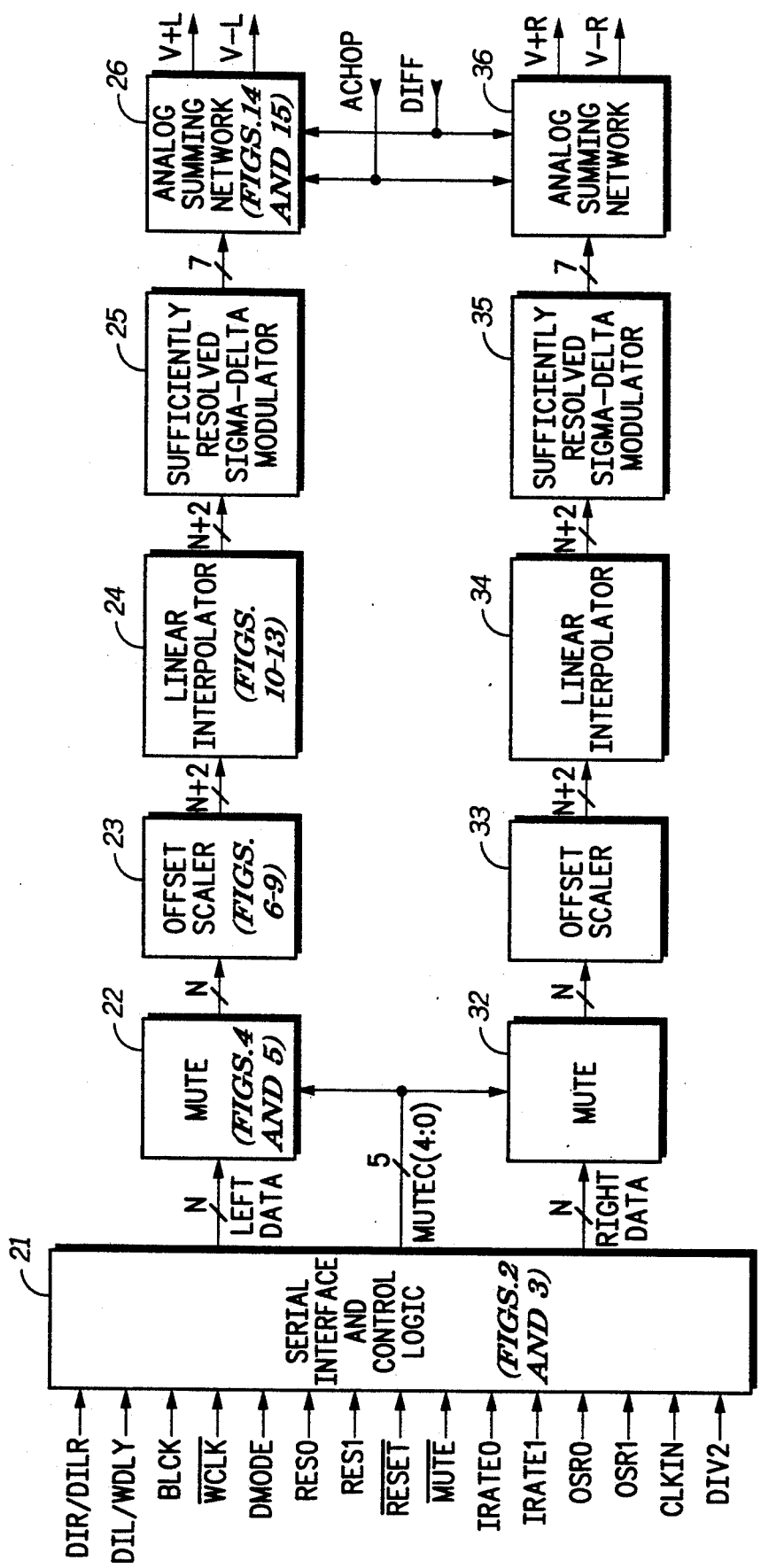
FIG. 1 illustrates in block diagram form an integrated circuit digital-to-analog converter (DAC) in accordance with the present invention.

FIG. 1 illustrates in block diagram form an integrated circuit digital-to-analog converter (DAC) 20 in accordance with the present invention. DAC 20 includes generally a serial interface and control logic block 21 which is shared between left and right channels, and circuitry particular to the left and right channels. The left-channel circuitry includes a mute circuit 22, an offset/scaler circuit 23, a linear interpolator 24, a sigma-delta modulator 25, and an analog summing network 26. Similarly, the right-channel circuitry includes a mute circuit 32, an offset/scaler circuit 33, a linear interpolator 34, a sigma-delta modulator 35, and an analog summing network 36. The left-channel and right-channel circuitry are identical except that they receive different input data. Thus, the operation of the right-channel circuitry will be described with reference to the operation of corresponding left-channel elements. Note that as used in this context, the term "DAC" refers to all elements illustrated in FIG. 1. However, the term DAC is commonly used in other contexts to refer only to the portion of the circuitry actually performing digital-to-analog conversion, for example sigma-delta modulator 25 and analog summing network 26.

Block 21 receives a number of control input signals which define its operating mode, as well as clock and left- and right-channel data signals. The input signals and their functions are more particularly detailed in TABLE I:

TABLE I

| Signal Name | Description |
| --- | --- |
| DMODE | Data input mode which indicates whether serial input data on the left and right channels is to be multiplexed onto the DIR pin or received in parallel on both the DIR and DIL pins |
| BCLK | Serial bit shift clock |
| $\overline{WCLK}$ | Word clock signal |
| DIL/WDLY | Left channel two's complement serial input data (DMODE at a logic low) or WCLK delay (DMODE at a logic high) |
| DIR/DILR | Right channel two's complement serial input data (DMODE at a logic low) or left and right channel multiplexed input data (DMODE at a logic high) |
| DIV/2 | Indicates that the clock input on the CLKIN pin is to be divided by 2 |
| CLKIN | High frequency operating clock input |
| IRATE0, IRATE1 | Indicates that the data received on the DIR and/or DIL inputs is 1×, 2×, 4×, or 8× interpolated data |
| MUTEN | Mute enable input |

TABLE I-continued

| Signal Name | Description |
| --- | --- |
| $\overline{RESET}$ | Reset pin |
| OSR0, OSR1 | Indicate whether a 128×, 192×, 256×, or 384× oversampling rate is to be used |
| RES0, RES1 | Indicate whether a 16-, 18-, or 20-bit serial interface is to be used |

Block 21 receives serial input data for the left and right channels, combines the data into N-bit words, and provides the N-bit words to both the left and right channels labelled, respectively, "LEFT DATA" and "RIGHT DATA".

DAC 20 provides a flexible data interface to solve the interface problems referred to above. First, DAC 20 is able to receive input data having either 16-, 18-, or 20-bit word lengths. Thus, DAC 20 provides upward compatibility with future designs. Second, DAC 20 reduces the cost of some applications by allowing input data to be multiplexed on a single pin (DIR/DILR). These modes are selected by input signals DMODE, RES1, and RES0 as illustrated in TABLE II:

TABLE II

| DMODE | RES1 | RES0 | Operating Mode |
| --- | --- | --- | --- |
| 0 | 0 | 0 | Dual data pin, 16-bit input |
| 0 | 0 | 1 | Dual data pin, 18-bit input |
| 0 | 1 | 0 | Dual data pin, 20-bit input |
| 0 | 1 | 1 | Undefined |
| 1 | 0 | 0 | Single data pin, 16-bit input |
| 1 | 0 | 1 | Single data pin, 18-bit input |
| 1 | 1 | 0 | Single data pin, 20-bit input |
| 1 | 1 | 1 | Undefined |

In addition, DAC 20 is able to control the audible pops which are present when DAC 20 is being powered up or powered down. Block 21 provides mute control signals labelled "MUTEC(4:0)" to mute blocks 22 and 32. The MUTEC(4:0) signals operate in two modes. When input signal $\overline{MUTE}$ becomes active, block 21 provides the encoded signals MUTEC(4:0) to sequentially mute the input data signal in 6 decibel (dB) steps from no attenuation to complete muting over approximately one-quarter of a second. When input signal $\overline{MUTE}$ becomes inactive, block 21 provides the encoded signals MUTEC(4:0) to sequentially increase or de-mute the input data signal in 6 decibel (dB) steps from complete attenuation to complete no muting (0 dB) over approximately one-quarter of a second. Thus, DAC 20 eliminates the undesirable pops associated with power up or power down.

Mute circuit 22 provides the muted, two's complement N-bit shifted data to offset/scaler circuit 23. Offset/scaler circuit 23 performs two data manipulation functions to improve the performance of DAC 20. First, offset/scaler 23 performs a three-quarters scaling (approximately 2.5 dB) in order to accommodate a full-scale input signal. Second, offset/scaler 23 adds an offset to center the resulting (N+2)-bit one's complement number at the center of the range of SRSD modulator 25.

Linear interpolator 24 receives the one's complement, (N+2)-bit output of offset/scaler circuit 23. Interpolator 24 is a lowpass first-order interpolating digital filter to increase the sampling rate and selectively be used for the different interpolation ratios. At the same time, interpolator 24 keeps the passband aliasing protection to the prescribed bound. Linear interpolator 24 provides an unsampled, one's complement, (N+2)-bit word at the rate of 8×, 16×, 32×, or 64× depending on the mode of operation.

SRSD modulator 25 receives the one's complement, (N+2)-bit word and converts it to an analog representation. An SRSD modulator was disclosed by Ledzius and Irwin in U.S. Pat. No. 5,057,840, issued Oct. 15, 1991, and assigned to the assignee hereof, which is herein incorporated by reference. SRSD modulator 25 uses seven output signals, including the most significant bit (designated "M19") and six less significant bits (designated "M10", "M9", "M8", "M7", "M6", and "M5") as feedback signals and provides the seven output signals to analog summing network 26. The six less significant bits closely approximate the performance which would be obtained by using an eleventh bit labelled "M11" as a single trim bit, but further improve small signal performance. Analog summing network 26 weights these signals in proportion to their significance and sums them. Analog summing network 26 has two additional modes. In one mode, an input signal labelled "ACHOP" is active, and analog summing network chops the output signal. This mode will be more particularly described with reference to FIGS. 10 and 11. DAC 20 enters another mode, known as the differential mode, in response to an input signal labelled "DIFF" becoming active. Signal DIFF defines whether the output is to be provided as a single-ended signal or as a differential signal. These input signals are summarized in TABLE III:

TABLE III

| Signal Name | Description |
|---|---|
| ACHOP | Indicates that the analog output bits are chopped with a frequency square wave to lower harmonic distortion due to rise/fall time pulse mismatch |
| DIFF | Indicates the analog output signals are to be output fully differential or single-ended |

FIG. 1 illustrates two differential output signals labelled "V+L" and "V−L" for analog summing network 26 and two output signals labelled "V+R" and "V−R" for analog summing network 36. The meaning of these signals depends on whether or not DAC 20 is in differential mode, and is summarized in TABLE IV:

TABLE IV

| Signal Name | Description |
|---|---|
| V + L | Left-channel positive analog output signal |
| V − L | Left channel negative analog output signal (differential mode) or voltage reference (single-ended mode) |
| V + R | Right channel positive analog output signal |
| V − R | Right channel negative analog output signal (differential mode) or voltage reference (single-ended mode) |

Figure 2:
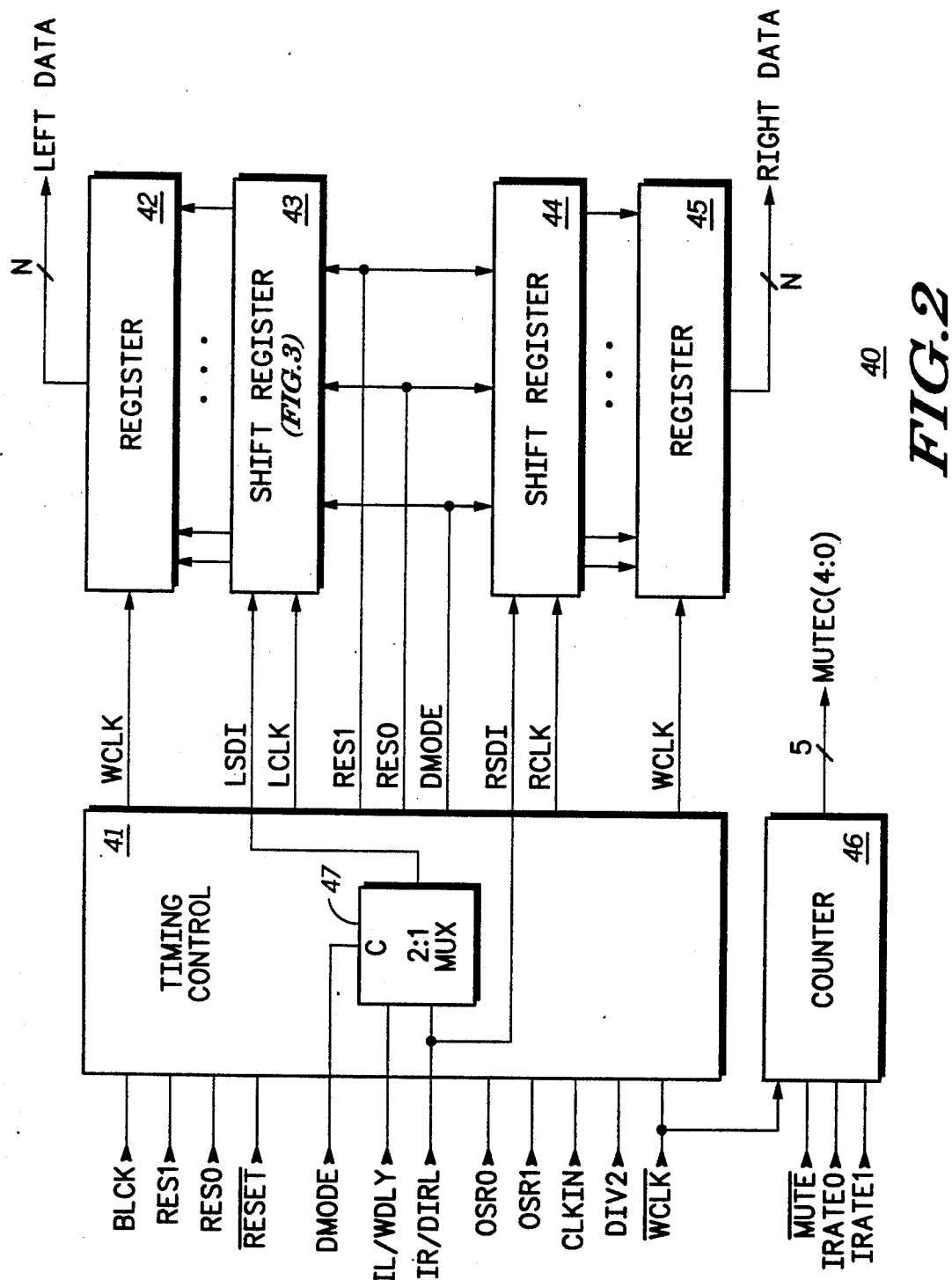
FIG. 2 illustrates in block diagram form a portion of the serial interface and control logic block of FIG. 1.

FIG. 2 illustrates in block diagram form a portion 40 of the serial interface and control logic block of FIG. 1. Portion 40 includes generally a timing control block 41, a register 42, shift registers 43 and 44, a register 45, and a counter 46. Timing control block 41 includes input buffers and timing logic for the further operation of DAC 20 of FIG. 1. Signals IRATE1, IRATE0, DIV/2, OSR1, and OSR0 define the clock rates as specified below in TABLE V:

TABLE V

| Input Signals | | | | | Operating Mode | | | |
|---|---|---|---|---|---|---|---|---|
| IRATE1 | IRATE0 | DIV2 | OSR1 | OSR0 | INPUT | OSR | CLKIN | INT. OSR |
| 0 | 0 | 0 | 0 | 0 | 1× | 128× | 128× | 64× |
| 0 | 0 | 0 | 0 | 1 | 1× | 192× | 192× | 64× |
| 0 | 0 | 0 | 1 | 0 | 1× | 256× | 256× | 64× |
| 0 | 0 | 0 | 1 | 1 | 1× | 384× | 384× | 64× |
| 0 | 0 | 1 | 0 | 0 | 1× | 128× | 256× | 64× |
| 0 | 0 | 1 | 0 | 1 | 1× | 192× | 384× | 64× |
| 0 | 0 | 1 | 1 | 0 | 1× | 256× | 512× | 64× |
| 0 | 0 | 1 | 1 | 1 | 1× | 384× | 768× | 64× |
| 0 | 1 | 0 | 0 | 0 | 2× | 128× | 128× | 32× |
| 0 | 1 | 0 | 0 | 1 | 2× | 192× | 192× | 32× |
| 0 | 1 | 0 | 1 | 0 | 2× | 256× | 256× | 64× |
| 0 | 1 | 0 | 1 | 1 | 2× | 384× | 384× | 64× |
| 0 | 1 | 1 | 0 | 0 | 2× | 128× | 256× | 32× |
| 0 | 1 | 1 | 0 | 1 | 2× | 192× | 384× | 32× |
| 0 | 1 | 1 | 1 | 0 | 2× | 256× | 512× | 64× |
| 0 | 1 | 1 | 1 | 1 | 2× | 384× | 768× | 64× |
| 1 | 0 | 0 | 0 | 0 | 4× | 128× | 128× | 16× |
| 1 | 0 | 0 | 0 | 1 | 4× | 192× | 192× | 16× |
| 1 | 0 | 0 | 1 | 0 | 4× | 256× | 256× | 32× |
| 1 | 0 | 0 | 1 | 1 | 4× | 384× | 384× | 32× |
| 1 | 0 | 1 | 0 | 0 | 4× | 128× | 256× | 16× |
| 1 | 0 | 1 | 0 | 1 | 4× | 192× | 384× | 16× |
| 1 | 0 | 1 | 1 | 0 | 4× | 256× | 512× | 32× |
| 1 | 0 | 1 | 1 | 1 | 4× | 384× | 768× | 32× |
| 1 | 1 | 0 | 0 | 0 | 8× | 128× | 128× | 8× |
| 1 | 1 | 0 | 0 | 1 | 8× | 192× | 192× | 8× |
| 1 | 1 | 0 | 1 | 0 | 8× | 256× | 256× | 16× |
| 1 | 1 | 0 | 1 | 1 | 8× | 384× | 384× | 16× |
| 1 | 1 | 1 | 0 | 0 | 8× | 128× | 256× | 8× |
| 1 | 1 | 1 | 0 | 1 | 8× | 192× | 384× | 8× |
| 1 | 1 | 1 | 1 | 0 | 8× | 256× | 512× | 16× |
| 1 | 1 | 1 | 1 | 1 | 8× | 384× | 768× | 16× |

Also illustrated as part of timing control block 41 is a multiplexer 21 labelled "2:1 MUX" having a first input terminal for receiving input signal DIL/WDLY, a second input terminal for receiving input signal DIR/-DILR, a control input terminal for receiving signal DMODE, and an output terminal for providing a left-channel data signal labelled "LSDI".

When signal DMODE is a logic low, DAC 20 is in dual data pin mode. Signal DIR/DILR operates as signal DIR, and signal DIL/WDLY operates as signal DIL. Multiplexer 47 provides signal DIL at its first input terminal to its output terminal. When signal DMODE is a logic high, DAC 20 is in single data pin mode. Signal DIL/WDLY operates as signal WDLY, and signal DIR/DILR operates as signal DILR. Signals LSDI and RSDI are both signal DILR. Since data is multiplexed on a single pin, signals LCLK and RCLK are respectively active when DILR provides left-channel or right-channel data, respectively.

Counter 46 receives signals IRATE1, IRATE0 and BCLK to count either from zero to a predetermined number (in response to input signal $\overline{\text{MUTE}}$ being activated), or from the predetermined number to zero (in response to signal $\overline{\text{MUTE}}$ being inactivated). The predetermined number is such that MUTEC(4:0), the most significant bits of counter 46, provide maximum, 19-bit attenuation after approximately one-quarter of a second. The predetermined number is the value of counter 46 when MUTEC(4:0) equal to (101000). Thus, counter 46 mutes or de-mutes a signal progressively in 6 dB increments in response to signal $\overline{\text{MUTE}}$. This muting prevents large pops which are encountered during power-on, in an inexpensive way. Signals MUTEC(4:0) represent the most-significant bits of counter 46.

Shift register 43 and register 42 are associated with the left channel. Signal LSDI represents the left-channel serial data which is valid when signal LCLK toggles. Shift register shifts in N bits, at which point word clock signal WCLK toggles, causing register 42 to latch in parallel the output signals of shift register 43. These signals are then provided stably as LEFT DATA until the next period of clock signal WCLK. Shift register 44 and register 45 receive right serial data input signal RSDI and right clock signal RCLK and output RIGHT DATA but otherwise perform identically as corresponding left-channel elements 43 and 42.

Figure 3:
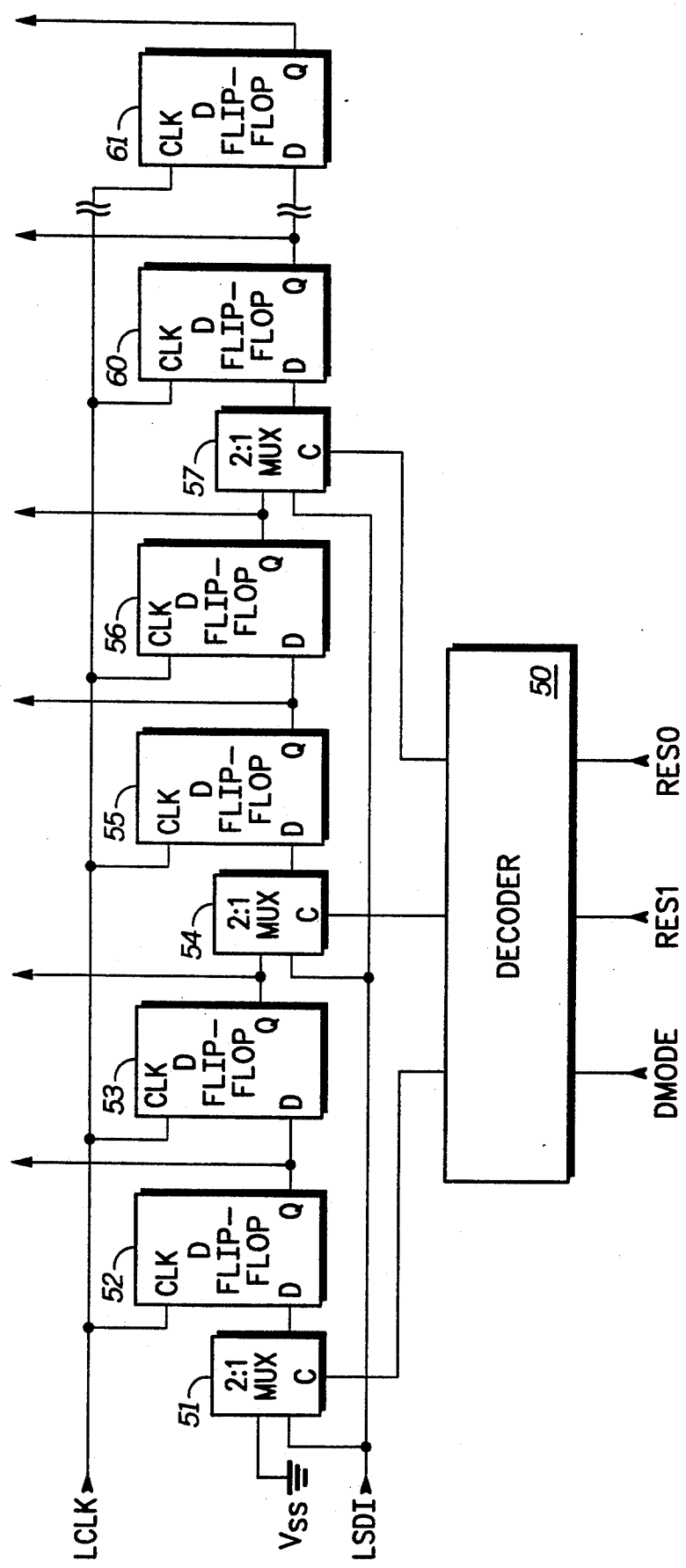
FIG. 3 illustrates in partial block diagram and partial logic diagram form the left-channel shift register of FIG. 1.

FIG. 3 illustrates in partial block diagram and partial logic diagram form the left-channel shift register 43 of FIG. 1. Shift register 43 includes a decoder 50, a multiplexer 51, D flip-flops 52 and 53, a multiplexer 54, D flip-flops 55 and 56, a multiplexer 57, and sixteen additional D flop-flops, including representative D flip-flops 60 and 61. Each flip-flop of shift register 43 is arranged in order from most significant flip-flop 52, to least-significant flip-flop 61, and has an input or D terminal, an output or Q terminal for providing a corresponding output bit of shift register 43, and a clock input terminal for receiving signal LCLK. In general, an output of a flip-flop is connected to an input of a next more significant flip-flop. One exception is that an input of flip-flop 52 is connected to an output of multiplexer 51. Multiplexer 51 also has a first input connected to a power supply voltage terminal labelled "$V_{SS}$", a second input for receiving signal LSDI, and a control input connected to decoder 50. Another exception is that multiplexer 54 is interposed between the output of flip-flop 53 and the input of flip-flop 55. Multiplexer 54 has a first input terminal connected to the output terminal of flip-flop 53, a second input terminal for receiving signal LSDI, a control input connected to decoder 50, and an output terminal connected to the input terminal of flip-flop 55. A further exception is that multiplexer 57 is interposed between flip-flop 56 and flip-flop 60. Multiplexer 57 has a first input terminal connected to the output terminal of flip-flop 56, a second input terminal for receiving signal LSDI, a control input terminal connected to decoder 50, and an output terminal connected to the input terminal of flip-flop 60.

Decoder 50 activates selected ones of multiplexers 51, 54, and 57 in order to recognize 16-, 18-, or 20-bit words, in response to input signals DMODE, RES1, and RES0. If 16-bit mode is indicated, decoder 50 activates multiplexer 57 to output the second input signal thereof. If 18-bit mode is indicated, decoder 50 activates multiplexer 54 to output the second input signal thereof, and multiplexer 57 to output the first input signal thereof. If 20-bit mode is selected, decoder 50 activates multiplexer 51 to output the second input thereof, and multiplexers 54 and 57 to output the first inputs thereof. Activation of multiplexers not previously mentioned are treated as don't-cares. Note that shift register 43 could be modified to support different or extra word sizes by changing the location or number of multiplexers, respectively, interposed in the series of flip-flops. Also, other clocked memory storage elements besides D flip-flops may also be used.

Figure 4:
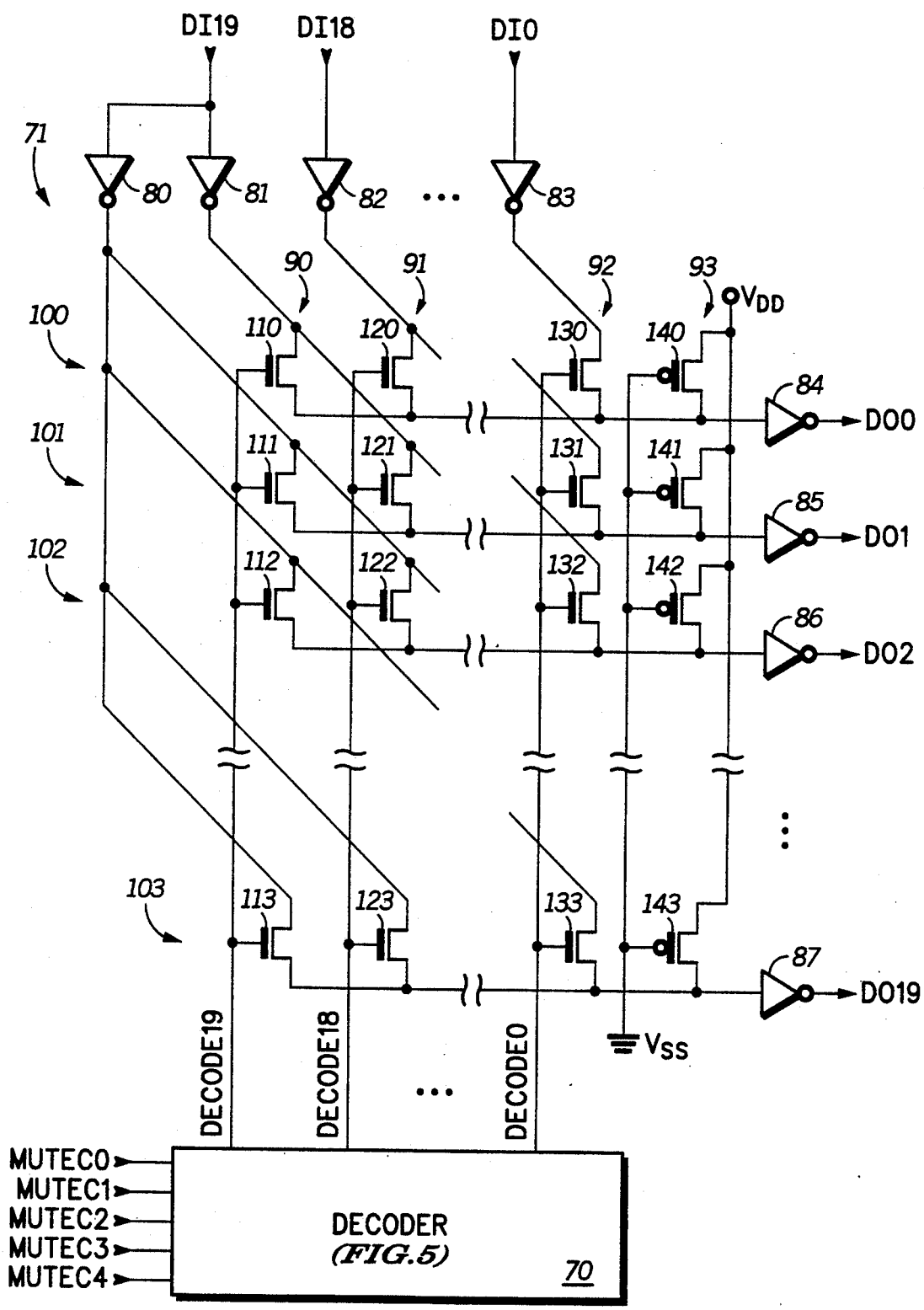
FIG. 4 illustrates in partial block diagram, partial logic diagram, and partial schematic diagram form the mute circuit of FIG. 1.

FIG. 4 illustrates in partial block diagram, partial logic diagram, and partial schematic diagram form mute circuit 22 of FIG. 1. Mute circuit 22 includes generally a decoder 70 and a shift matrix 71. Note that also counter 46 of FIG. 2 is important in the operation of mute circuit 22 but was illustrated separately because it is common to both the left and right channels. Decoder 70 receives the MUTEC(4:0) signals from counter 46 and activates one of twenty decoder control signals labelled "DECODE(19:0)", of which DECODE19, DECODE18, and DECODE0 are illustrated in FIG. 4. As used in FIG. 4, DECODE19 represents a 19-bit muting, DECODE18 represents an 18-bit muting, etc. DECODE0 represents no muting (0 dB).

Shift matrix 71 receives twenty data input signals labelled "DI(19:0)", of which signals DI19, DI18, and DI0 are illustrated in FIG. 4. In response, shift matrix 71 provides twenty data output signals labelled "DO(19:0)", of which signals DO19, DO2, DO1, and DO0 are illustrated in FIG. 4. Thus, mute circuit 22 supports 20-, 18-, and 16-bit data word lengths.

Shift matrix 71 is organized into 20 rows crossing 20 columns. In FIG. 4, columns 90, 91, and 92 are shown. In addition, shift matrix 71 includes a column 93 of pullup devices. Rows 100, 101, 102, and 103 are shown. Each row/column intersection has an associated N-channel transistor. For example, the intersection of row 100 and column 90 is associated with an N-channel transistor 110. N-channel transistor 110 has a first source/drain terminal, a gate for receiving signal DECODE19, and a second source/drain terminal connected to row 100. Other transistors on row 100 have a first source/drain terminal, a gate connected to a corresponding DECODE(19:0) signal, and a second source/drain terminal connected to row 100. Likewise, transistors on rows 101, 102, and 103 each have first source/drain terminals, gates connected to corresponding DECODE(19:0) signals, and second source/drain terminals connected to their associated rows. Column 93 includes P-channel transistors each having a source connected to a power supply voltage terminal labelled "$V_{DD}$", a gate connected to $V_{SS}$, and a drain connected to a corresponding row. $V_{DD}$ is a positive power supply voltage terminal typically at 5.0 volts. P-channel transistors in column 93 have gate sizes small enough so that the N-channel transistors in shift matrix 71 can overdrive them.

Each input signal DI(19:0) is received at an input terminal of a corresponding inverter. In FIG. 4, signal DI19 is received at an input of an inverter 81, signal DI18 is received at an input terminal of an inverter 82, and signal DI0 is received at an input terminal of an inverter 83. In addition, signal DI19 is received at an input terminal of an additional inverter 80. Each N-channel transistor in shift matrix 71 is connected to an output terminal of an inverter. The first source/drain terminal of each transistor in column 90 (which corresponds to a muting of 19 bits) receives signal $\overline{DI19}$. The first source/drain terminal of each transistor in column 91 (which corresponds to a muting of 18 bits) receives signal $\overline{DI19}$, except for the first source/drain terminal of transistor 120, which receives signal $\overline{DI18}$. The same pattern continues throughout shift matrix 71 until in column 92, the first source/drain terminal of transistor 130 receives signal $\overline{DI0}$, the first source/drain terminal of transistor 131 receives signal $\overline{DI1}$, the first source/drain terminal of transistor 132 receives signal $\overline{DI2}$, and so on. Each row is also connected to an input terminal of an inverter; FIG. 4 illustrates inverters 84, 85, 86, and 87 connected to rows 100, 101, 102, and 103, respectively. The output terminals of inverters 84, 85, 86, and 87 provide output signals DO0, DO1, DO2, and DO3, respectively.

Figure 5:
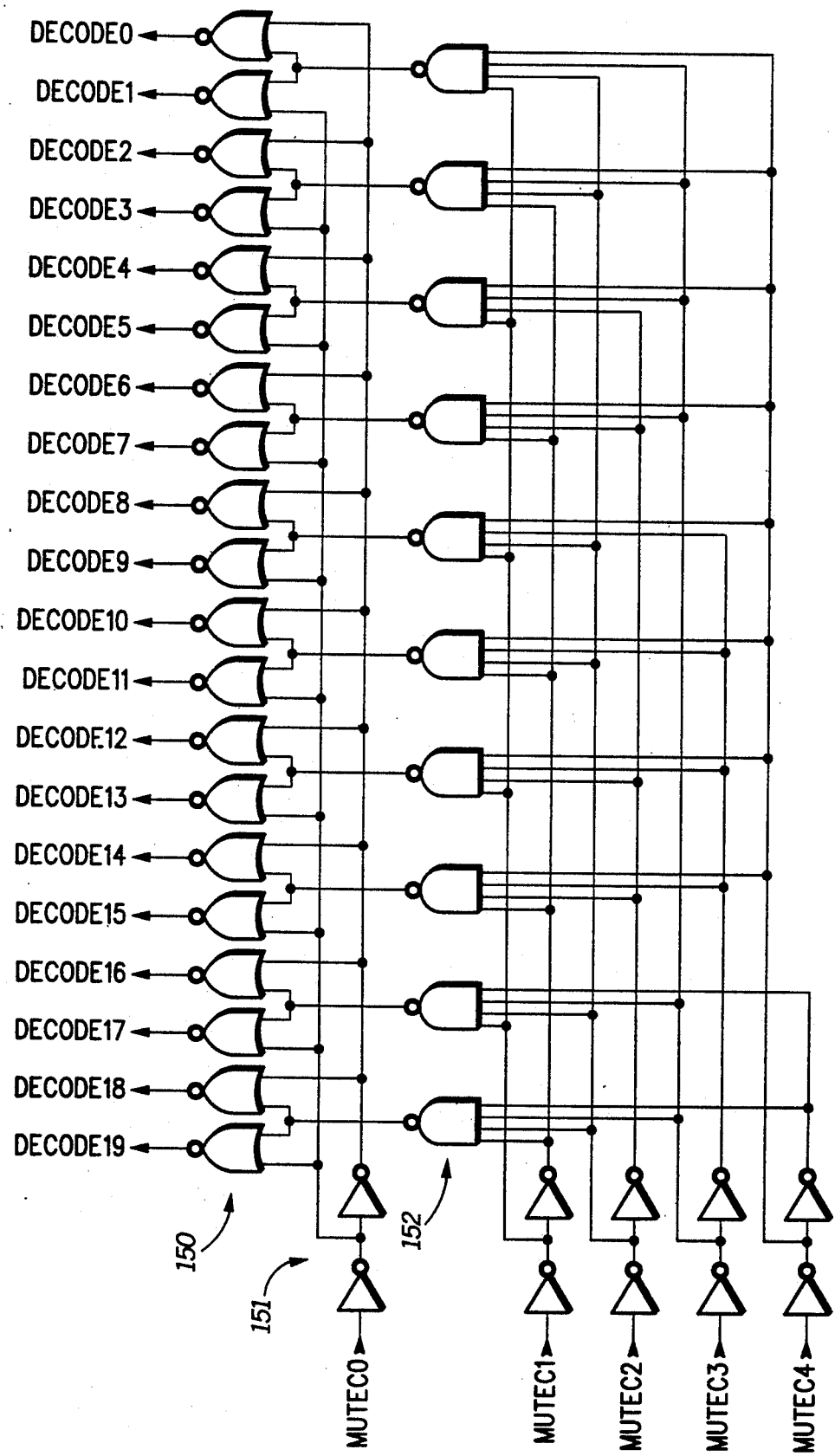
FIG. 5 illustrates in schematic form the decoder circuit of FIG. 4.

FIG. 5 illustrates in schematic form decoder circuit 70 of FIG. 4. Decoder circuit 70 is illustrative of many possible decoder circuits for providing the DECODE(19:0) signals. Decoder circuit 70 includes generally a NOR gate section 150, an inverter section 151, and a NAND gate section 152. Inverter section 151 receives signals MUTEC(4:0) and provides both corresponding true and complement signals. Since MUTEC0 is the least-significant signal, NOR gate section 150 alternately selects adjacent signal lines in response to a change in MUTEC0. NAND gate section 152, on the other hand, includes 4-input NAND gates to perform a partial decode. Signal MUTEC4 is the most-significant signal and is used in only the last two NAND gates.

Figure 6:
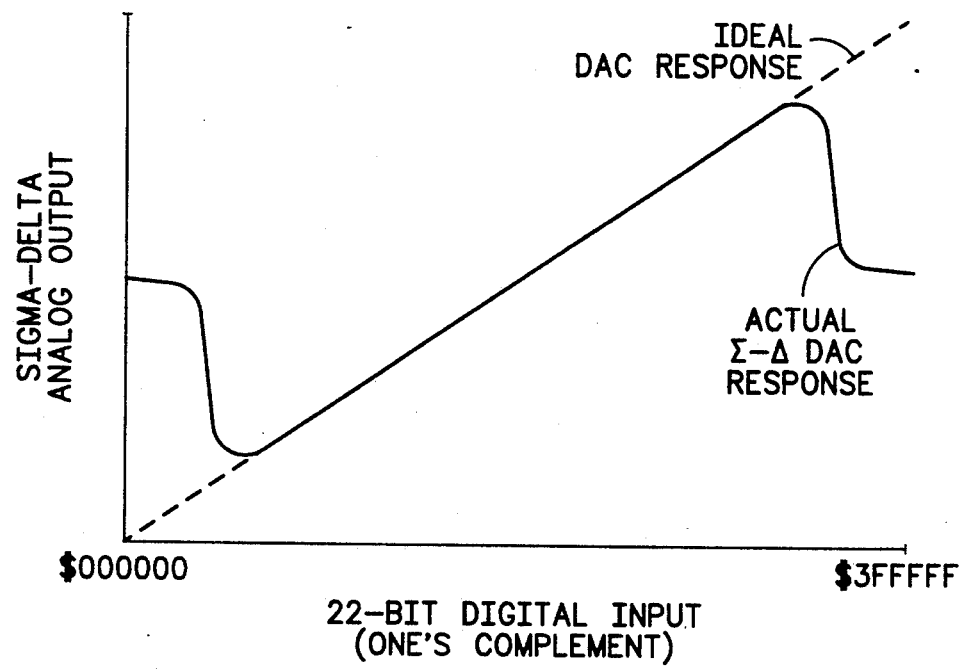
FIG. 6 illustrates a graph of a transfer function of an analog-to-digital converter based on a sigma-delta modulator.

FIG. 6 illustrates a graph of a transfer function of an analog-to-digital converter based on a sigma-delta modulator. The horizontal axis represents a 22-bit digital input signal in one's complement form presented to a sigma-delta modulator, such as sigma-delta modulator 25 of FIG. 1. The input data ranges from $000000 to $3FFFFF, with $000000 representing no signal, and $3FFFFF representing full scale. The vertical axis represents the analog output signal of the summing network connected to the sigma-delta modulator, such as summing network 26 of FIG. 1. A dashed line labelled "IDEAL DAC RESPONSE" represents an ideal, perfectly linear input-output characteristic. A solid curve labelled "ACTUAL Σ-Δ DAC RESPONSE", however, represents the actual performance of a second-order sigma-delta modulator. While the illustrated ACTUAL Σ-Δ DAC RESPONSE characteristic corresponds to that produced by sigma-delta modulators with orders greater than one, it may also be produced by first-order sigma-delta modulators. The ACTUAL Σ-Δ DAC RESPONSE characteristic represents the tradeoff associated with sigma-delta modulators: they give up approximately 1-2 dB in dynamic range in order to randomize and shape the quantization error out-of-band. However, this tradeoff is unacceptable for systems which encounter signals in the upper end of the input range, and new approaches are needed.

Figure 7:
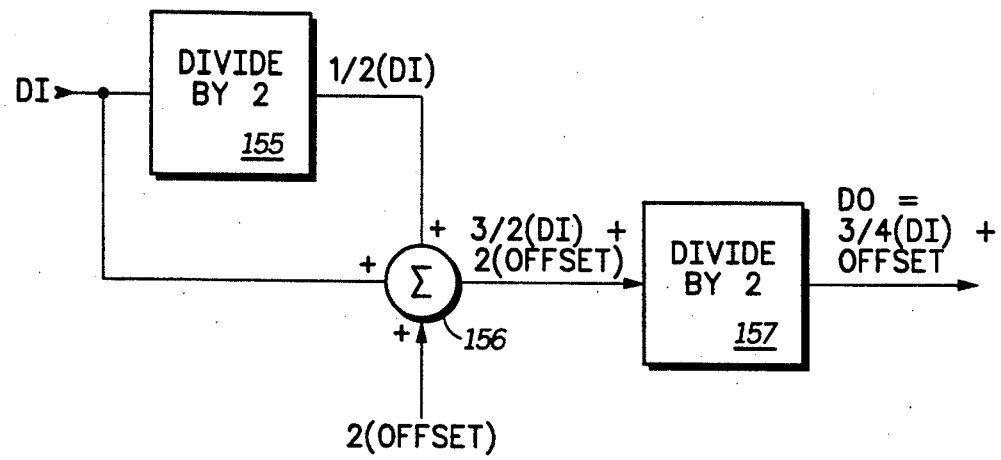
FIG. 7 illustrates in block diagram form a functional block diagram of the offset/scaler of FIG. 1.

FIG. 7 illustrates in block diagram form a functional block diagram of the offset/scaler 23 of FIG. 1. Functionally, offset/scaler 23 receives a 22-bit input signal labelled "DI". DI is first divided by two in block 155, and then added to itself in summation block 156. Summation block 126 also receives a value which is twice a desired offset, and is thus labelled "2(OFFSET)". The sum produced by block 156 is thus 3/2(DI)+2(OFFSET), which is in turn divided by two in block 157 to provide the desired output DO equal to 3/4(DI)+OFFSET. Thus, offset/scaler 23 reduces the full-scale signal by three-quarters to compensate for the loss of dynamic range of second-order sigma-delta modulator 25 of FIG. 1, and to provide an OFFSET to ensure that a coarse bit of sufficiently resolved sigma-delta modulator 25 goes into an idle pattern for small signal inputs.

FIG. 8 illustrates in partial block diagram and partial logic diagram form offset/scaler 23 of FIGS. 1 and 7. Offset/scaler 23 includes a first portion 160 for processing the first seven output signals DO0-DO6, and a second portion 161 for processing the succeeding six output signals DO7-DO12, and a third portion 162 for processing the remaining nine output signals. Portion 160 includes a half adder 170, and six full adders including illustrative full adders 171, 172, and 173. As used here, a half adder is an adder with two inputs labelled respectively "A" and "B", a sum output labelled "S", and a carry output labelled "CO". A full adder is the same as a half adder but includes a carry input terminal labelled "CI". Since half adders require less circuit area, they are preferred when a carry input is not needed. First portion 160 provides data output signal DO0 directly as data input signal DI0. Note that as used here, data input signals such as DI0 correspond to data output signals of the previous block (mute circuit 22). Thus, DI0 is equivalent to DO0 of mute circuit 22. Half adder 170 has an A input terminal for receiving input signal DI1, a B input terminal for receiving input signal DI0, an S output terminal for providing output signal DO1, and a CO output terminal. Full adder 171 has an A input terminal for receiving input signal DI2, a B input terminal for receiving input signal DI1, a CI input terminal connected to the CO output terminal of half adder 170, an S output terminal for providing output signal DO2, and a CO output terminal. Full adder 172 has an A input terminal for receiving input signal DI3, a B input terminal for receiving input signal DI2, a CI input terminal connected to the CO output terminal of full adder 171, an S output terminal for providing output signal DO3, and a CO output terminal. The following three full adders of portion 160 (not shown in FIG. 6) have inputs and outputs connected in the same pattern as full adders 171 and 172. Full adder 173 has an A input terminal for receiving input signal DI7, a B input terminal for receiving input signal DI6, a CI input terminal connected to the CO output terminal of the previous full adder (not shown), an S output terminal, and a CO output terminal.

Portion 161 includes two rows of adders. One row includes six full adders including illustrative full adders 181 and 183. A second row includes a half adder 180 and five full adders including illustrative full adders 182 and 184. Half adder 180 has an A input terminal connected to the S output terminal of full adder 173, a B input terminal connected to $V_{DD}$, an S output terminal for providing output signal DO7, and a CO output terminal. Full adder 181 has an A input terminal for receiving input signal DI8, a B input terminal for receiving input signal DI7, a CI input terminal connected to the CO output terminal of full adder 173, an S output terminal, and a CO output terminal. Full adder 182 has an A input terminal connected to the S output terminal of full adder 181, a B input terminal connected to $V_{DD}$, a CI input terminal connected to the CO output terminal of half adder 172, an S output terminal for providing signal DO8, and a CO output terminal. Full adder 183 has an A input terminal for receiving input signal DI9, a B input terminal for receiving input signal DI8, a CI input terminal connected to the CO output terminal of full adder 181, an S output terminal, and a CO output terminal. Lastly, full adder 184 has an A input terminal connected to the S output terminal of a previous full adder (not shown), a B input terminal connected to $V_{DD}$, a CI input terminal connected to the CO output terminal of a previous full adder (not shown), an S output terminal for providing signal DO12, and a CO output terminal.

Portion 162 also includes two rows of adders. One row includes seven full adders including illustrative full adder 187, an inverter 189, and a half adder 190. A second row includes six half adders including illustrative half adders 185 and 186, a full adder 188, a half adder 191, and an exclusive OR gate 192. The first row of portion 162 includes the same pattern of connections for full adders as for full adders 181 and 183 of second portion 161. However, the second row of portion 162 includes adders corresponding to full adders 180, 182, and 184 but which are implemented in half adders in which the B input terminal is connected to the CO output terminal of a previous adder instead of to $V_{DD}$. Half adder 185 has an A input terminal connected to the S output terminal of a previous full adder, a B input terminal connected to the CO output terminal of full adder 184, an S output terminal for providing signal DO13, and a CO output terminal. Half adder 186 has an A input terminal connected to the S output terminal of a previous full adder, a B input terminal connected to the CO output terminal of a previous half adder, an S output terminal for providing signal DO18, and a CO output terminal. Full adder 187 has an A input terminal, a B input terminal for receiving signal DI18, a CI input terminal connected to a CO terminal of a previous full adder, an S output terminal, and a CO output terminal. Full adder 188 has an A input terminal connected to the S output terminal of full adder 187, a B input terminal connected to $V_{DD}$, a CI input terminal connected to the CO output terminal of half adder 186, an S output terminal for providing signal DO19, and a CO output terminal. Inverter 189 has an input terminal for receiving signal DI19, and an output terminal connected to the A input terminal of full adder 187. Half adder 190 has an A input terminal connected to the output terminal of inverter 189, a B input terminal connected to the CO output terminal of full adder 187, an S output terminal, and a CO output terminal. Half adder 191 has an A input terminal connected to the S output terminal of half adder 190, a B input terminal connected to the CO output terminal of full adder 188, an S output terminal for providing signal DO20, and a CO output terminal. Exclusive OR gate 192 has a first input terminal connected to the CO output terminal of half adder 190, a second input terminal connected to the CO output terminal of half adder 191, and an output terminal for providing output signal DO21.

Offset/scaler 23 performs two functions. First, offset/scaler 23 performs a three-quarters (approximately 2.5 dB) scaling of the input signal. Offset/scaler 23 achieves the three-quarter scaling by adding the input number to one-half of itself, and then dividing the result by two (by performing a left shift). Thus, adders receive the corresponding input bit on the B input, and the next-higher corresponding input bit on the A input.

Second, offset/scaler 23 inserts an offset which, after a final left shift, is equal to $1F80. This value is equal to one-half of trim bit M11 (which modulator 25 approximates by using bits M10-M5 as feedback bits). Half adder 180 and full adders 182 and 184 and three full adders not shown each have a B input connected to $V_{DD}$, which inserts a "1" into the data pattern for the corresponding bit positions. The offset insures that the coarse bit of sufficiently-resolved sigma-delta modulator 25 goes into the idle pattern for small signal inputs.

TABLE VI summarizes the effect of the offset and scaling on various input numbers. Note that input numbers DI(19:0) are in two's complement format, and output numbers DO(21:0) are in one's complement format.

TABLE VI

| DI(19:0) | DO(21:0) |
|---|---|
| $80000 | $081F80 |
| $90000 | $0B1F80 |
| $A0000 | $0E1F80 |
| $B0000 | $111F80 |
| $C0000 | $141F80 |
| $D0000 | $171F80 |
| $E0000 | $1A1F80 |
| $F0000 | $1D1F80 |
| $FFFFE | $201F7A |
| $FFFFF | $201F7D |
| $00000 | $201F80 |
| $10000 | $231F80 |
| $20000 | $261F80 |
| $30000 | $291F80 |
| $40000 | $2C1F80 |
| $50000 | $2F1F80 |
| $60000 | $321F80 |
| $70000 | $351F80 |
| $7FFFF | $381F7D |

Figure 9:
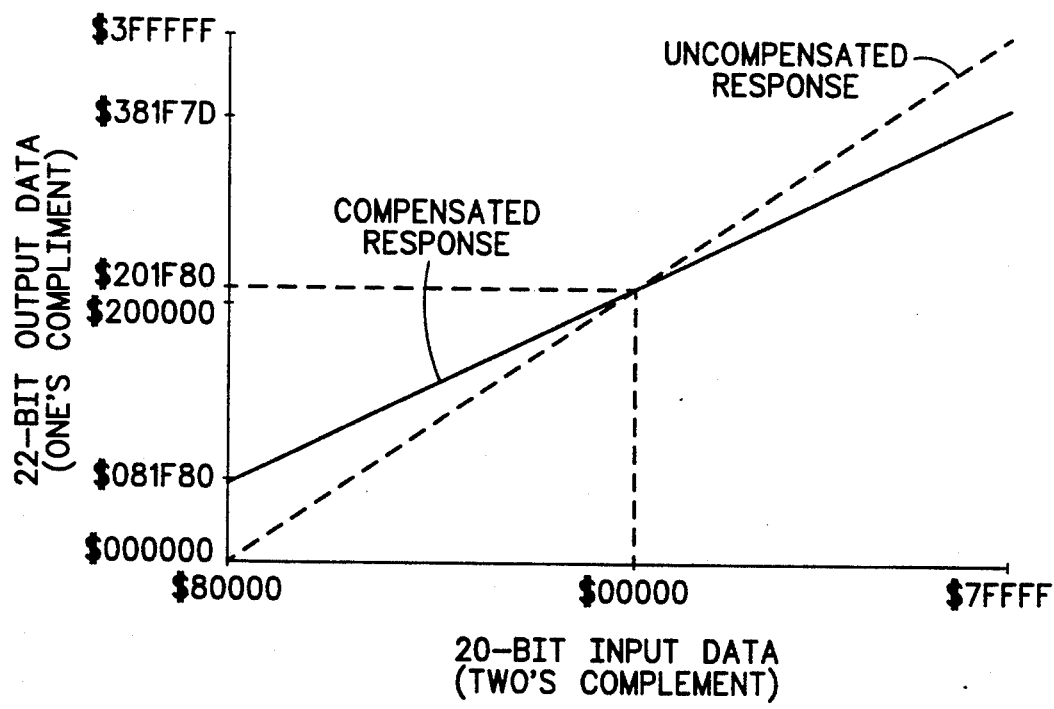
FIG. 9 illustrates a graph of the transfer function of the offset/scaler of FIG. 6.

FIG. 9 illustrates a graph of the transfer function of offset/scaler 23 of FIG. 6 which is useful in understanding the improvement in the operation of DAC 20. In FIG. 9, the horizontal axis represents the 20-bit, two's complement input data to offset/scaler 23. The vertical axis represents the 22-bit, one's complement output data of offset/scaler 23. A dashed line labelled "UNCOMPENSATED" represents an uncompensated two's complement-to-one's complement transformation. The solid line labelled "COMPENSATED RESPONSE" represents the output of offset/scaler 23. Offset/scaler 23 transforms the smallest (most-negative) input number ($80000 in two's complement) to the 22-bit, one's complement output number $081F80, which represents a three-quarters scaling with an added offset of $1F80. Similarly, offset/scaler 23 transforms the largest positive number ($7FFFF) to the 22-bit, one's complement number $381F7D. Referring again to FIG. 6, it is seen that this scaling transforms a full-scale (both negative and positive) into scaled numbers which are within the linear range of a sigma-delta modulator. In addition, offset/scaler 23 ensures that the coarse bit of sigma-delta modulator 25 goes into an idle pattern by adding an offset of $1F80.

Figure 10:
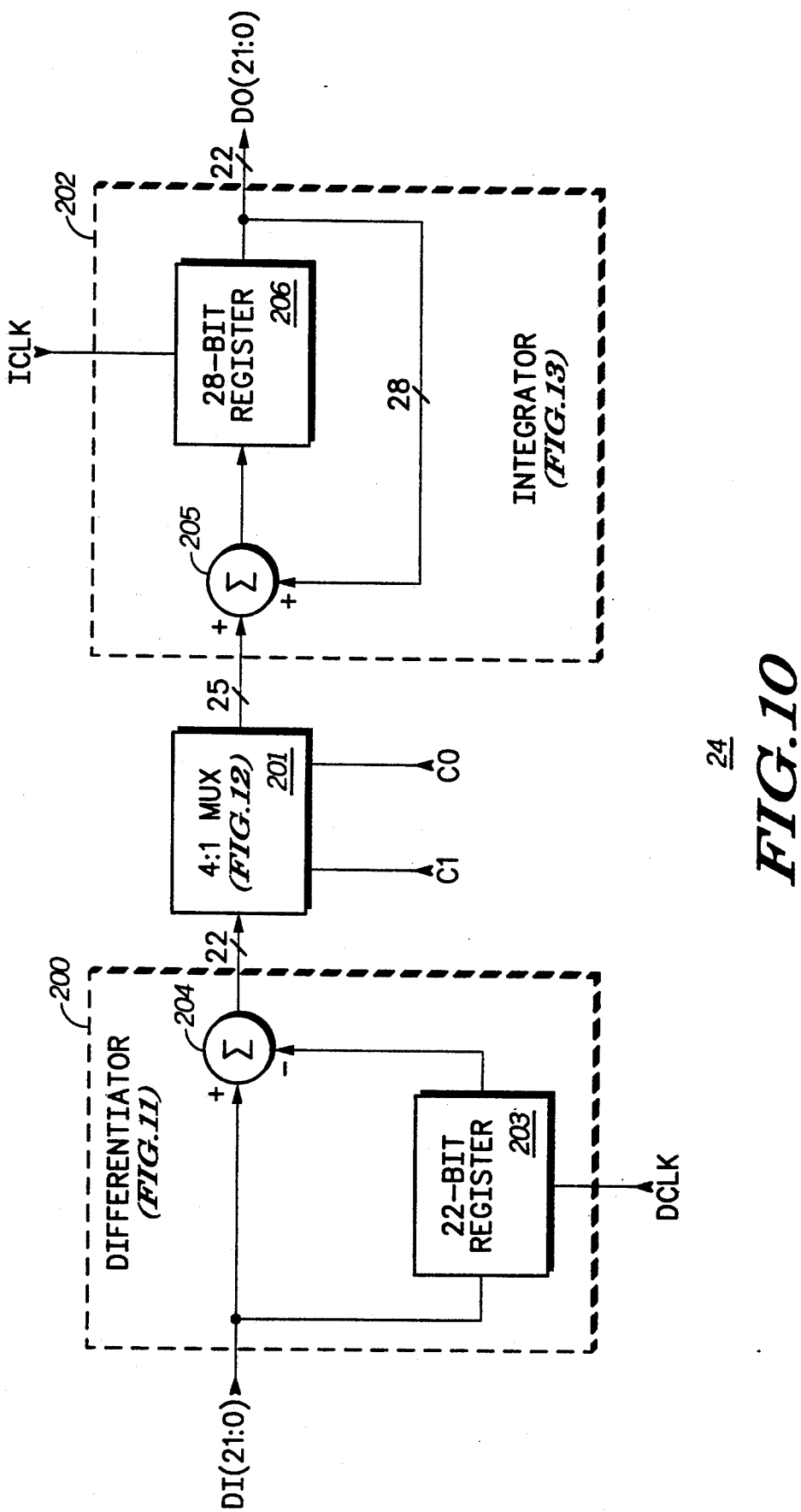
FIG. 10 illustrates a functional block diagram of the linear interpolator of FIG. 1.

FIG. 10 illustrates a functional block diagram of linear interpolator 24 of FIG. 1. Linear interpolator 24 includes generally a differentiator 200, a multiplexer 201, and an integrator 202. Differentiator 200 includes a 22-bit register 203 for receiving the 22-bit, one's complement output of offset/scaler 23, labelled "DI(21:0)", a clock input for receiving a decimated clock signal labelled "DCLK" for latching DI(21:0) into register 203, and a complementary output. Differentiator 200 also includes a summing device 204 having a first input for receiving signals DI(21:0), a second input connected to the complementary output of register 203, and an output for providing the output of differentiator 200. Differentiator 200 is a digital differentiator which computes the difference between the input signal DI(21:0) and its previous value at the last transition of the decimation clock DCLK.

Multiplexer 201 is a 4-to-1 multiplexer having a 22-bit input connected to the output of differentiator 200, a 25-bit output, and two control terminals respectively receiving input signals labelled "C0" and "C1". Multiplexer 201 adjusts the positions of the 22 input bits based on the values of C1 and C0, as shown below in TABLE VII:

TABLE VII

| CONTROL LINES | | MUX INPUT | INTERP. RATIO | INTEGRATOR REGISTER WIDTH |
|---|---|---|---|---|
| C1 | C0 | | | |
| 0 | 0 | A | 64 | 22 + 6 = 28 |
| 0 | 1 | B | 32 | 22 + 5 = 27 |
| 1 | 0 | C | 16 | 22 + 4 = 26 |
| 1 | 1 | D | 8 | 22 + 3 = 25 |

The values of C1 and C0 determine how the leftmost or rightmost bits are handled. For example, for values of C1 and C0 both equal to 0, a sign extension bit from differentiator 200 is inserted into the upper three bit positions (corresponding to bits 24, 23, and 22), with the twenty-two output bits of differentiator 200 being multiplexed into the lower twenty-two bit positions. On the other hand, for values of C1 and C0 both equal to one, the twenty-two output bits of differentiator 200 are multiplexed onto the upper twenty-two bit positions, with a zero multiplexed onto bit positions 2, 1, and 0.

Integrator 202 includes a summing device 205 having a first input connected to the 25-bit output of multiplexer 201, a second input, and an output. Summing device 205 is a twenty-eight bit summing device receiving output bits form multiplexer 201 on a lower 25 bits thereof, and the sign extension on an upper three bits thereof. Integrator 202 also includes a 28-bit register 206 having an input for receiving the 28-bit output of summing device 205, a clock input for receiving a clock signal labelled "ICLK" for latching the input into register 206, and a 22-bit output connected to the second input of summing device 205 and for providing output signals labelled "DO(21:0)" thereon. The 22-bit output of register 206 corresponds to an upper twenty-two bits thereof.

Linear interpolator 24 is a lowpass, first-order interpolating digital comb filter which increases the sampling rate for various interpolation rates. At the same time, linear interpolator 24 keeps the passband aliasing protection within a prescribed bound. Linear interpolator 24 receives the 22-bit, one's complement output of offset/scaler 23 at a rate determined by signal DCLK. The output, on the other hand, is interpolated at a rate of 8×, 16×, 32×, or 64×. The interpolation rate is equal to ($f_{ICLK}/f_{DCLK}$), where $f_{ICLK}$ is the frequency of signal ICLK, and $f_{DCLK}$ is the frequency of DCLK. Input signals IRATE1, IRATE0, DIV2, OSR1, and OSR0 determine the interpolation rate in a manner previously illustrated in TABLE V.

The transfer function H(z) of linear interpolator 24 is given by:

$$H(z) = [(1-z^{-p})/(1-z^{-1})]^N$$

where p is the interpolation ratio and is equal to ($f_{ICLK}/f_{DCLK}$), and N is the number of stages (one for linear interpolator 24). The transfer function H(z) has zeros at $f_{DCLK}$ and its multiples. Thus, linear interpolator 24 attenuates any aliases around $f_{DCLK}$ and its multiples. Because it has a sin(x)/x frequency response, it does not have a sharp rolloff at the passband edge.

The performance of linear interpolator 24 is shown below in TABLE VII:

TABLE VIII

| INTERP. RATIO | INPUT | INTEGR. REGISTER WIDTH | MAX ATTENUATION AT PASS BAND EDGE (of 24 kHz) | PROTECTION AGAINST ALIASING |
|---|---|---|---|---|
| 8 | 8× | 25 | −0.0558 dB | −23.57 dB |
| 16 | 4× | 26 | −0.2244 dB | −17.126 dB |
| 32 | 2× | 27 | −0.912 dB | −10.454 dB |
| 64 | 1× | 28 | −3.922 dB | −3.992 dB |

Linear interpolator 24 provides an improvement over other possible interpolator designs by placing multiplexer 201 between differentiator 200 and integrator 202. If multiplexer 201 were placed before differentiator 200, then the width of differentiator 200 would have to be increased to handle the highest oversampling rate. If multiplexer 201 were placed after integrator 202, then multiplexer 201 would be in the critical path between linear interpolator 24 and modulator 25. Linear interpolator 24 avoids both problems by placing multiplexer 201 between differentiator 200 and integrator 202.

Figure 11:
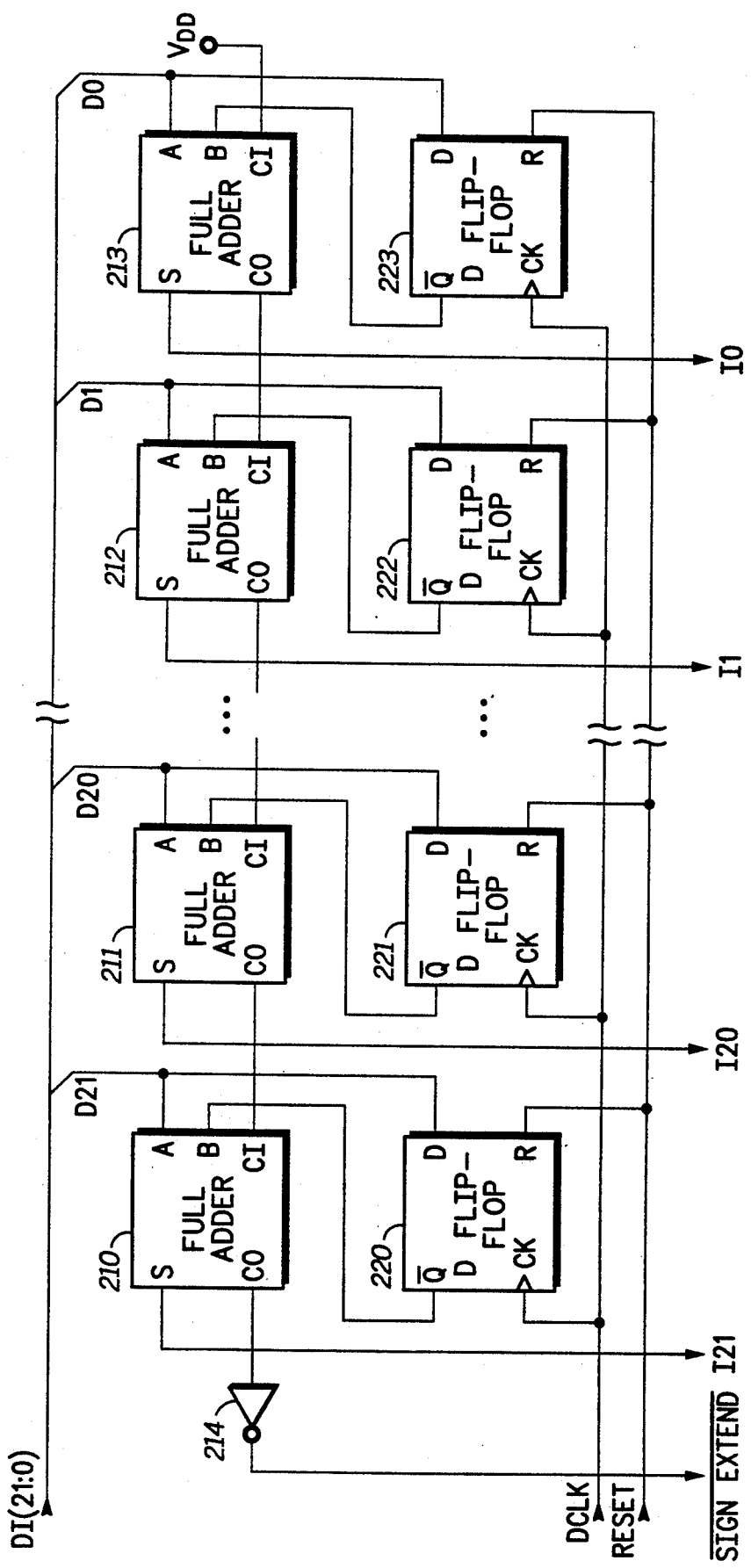
FIG. 11 illustrates in partial block diagram form and partial logic diagram form the differentiator of FIG. 10.
Figure 12:
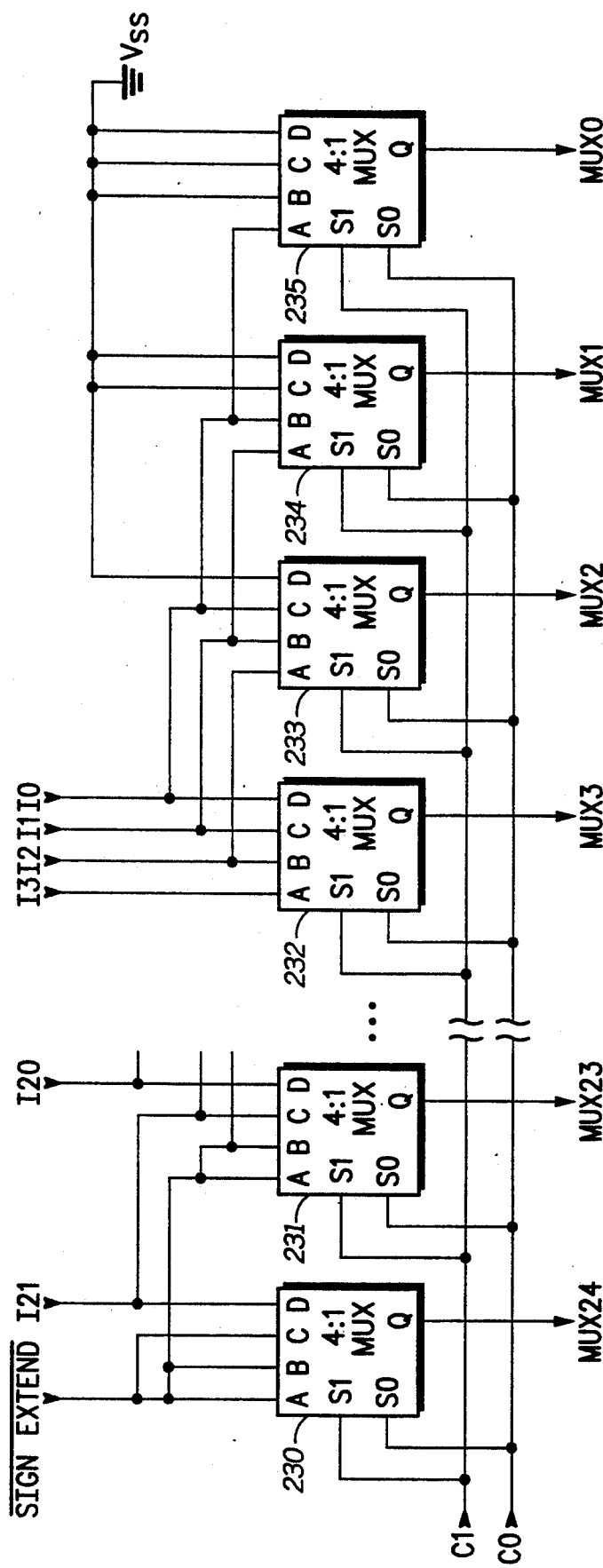
FIG. 12 illustrates in block diagram form the multiplexer of FIG. 10.
Figure 13:
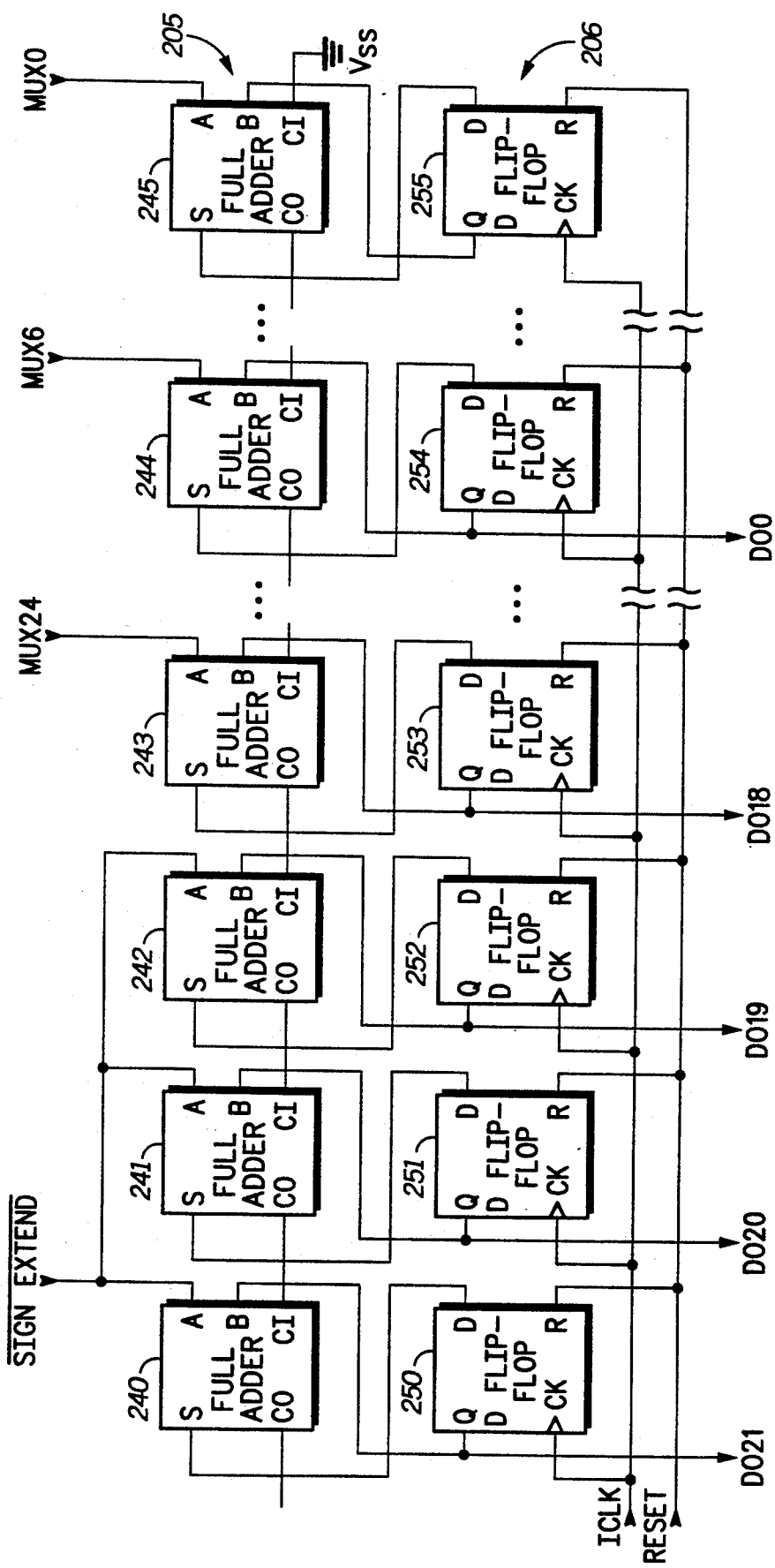
FIG. 13 illustrates in block diagram form the integrator of FIG. 10.

FIGS. 11, 12, and 13 illustrate by way of example particular circuitry which implements linear interpolator 24 of FIG. 10. It should be noted that other circuitry is possible. FIG. 11 illustrates in partial block diagram form and partial logic diagram form differentiator 200 of FIG. 10. Register 203 of differentiator 200 includes D flip-flops 220, 221, 222, and 223. Each D flip-flop has a D input terminal, a reset input terminal labelled "R", a clock input terminal labelled "CK", and a complementary output terminal labelled "$\overline{Q}$". Flip-flop 220 has a D input terminal for receiving signal D21, an R input terminal for receiving a reset signal labelled "RESET", a clock input terminal for receiving signal DCLK, and a $\overline{Q}$ output terminal. Flip-flop 221 has a D input terminal for receiving signal D20, an R input terminal for receiving signal RESET, a clock input terminal for receiving signal DCLK, and a $\overline{Q}$ output terminal. Register 203 includes eighteen additional D flip-flops having connections corresponding to flip-flops 220 and 221. Flip-flop 222 has a D input terminal for receiving signal D1, an R input terminal for receiving signal RESET, a clock input terminal for receiving signal DCLK, and a $\overline{Q}$ output terminal. Flip-flop 223 has a D input terminal for receiving signal D0, an R input terminal for receiving signal RESET, a clock input terminal for receiving signal DCLK, and a $\overline{Q}$ output terminal.

Summing device 204 of differentiator 200 includes full adders 210, 211, 212, and 213, and an inverter 214. As before, each full adder has A and B input terminals, a CI input terminal, and S and CO output terminals. As illustrated in FIG. 11, summing device 204 of differentiator 200 includes full adders 201, 211, 212, and 213, and an inverter 214. Full adder 210 has an A input terminal for receiving signal D21, a B input terminal connected to the $\overline{Q}$ output terminal of D flip-flop 220, a CI input terminal, an S output terminal for providing a signal labelled "I21", and a CO output terminal. Full adder 211 has an A input terminal for receiving signal D20, a B input terminal connected to the $\overline{Q}$ output terminal of D flip-flop 221, a CI input terminal, an S output terminal for providing a signal labelled "I21", and a CO output terminal connected to the CI input terminal of full adder 210. Full adder 212 has an A input terminal for receiving signal D1, a B input terminal connected to the $\overline{Q}$ output terminal of D flip-flop 222, a CI input terminal, an S output terminal for providing a signal labelled "I1", and a CO output terminal connected to the CI input terminal of a previous full adder (not shown). Full adder 213 has an A input terminal for receiving signal D0, a B input terminal connected to the $\overline{Q}$ output terminal of D flip-flop 223, a CI input terminal connected to $V_{DD}$, an S output terminal for providing a signal labelled "I0", and a CO output terminal connected to the CI input terminal of full adder 212. Inverter 214 has an input terminal connected to the CO output terminal of full adder 210, and an output terminal for providing a signal labelled "$\overline{\text{SIGN EXTEND}}$".

FIG. 12 illustrates in block diagram form multiplexer 201 of FIG. 10. Multiplexer 201 includes twenty-five 4:1 multiplexer cells including illustrative multiplexers 230-235. Each multiplexer cell has four data input terminals labelled "A", "B", "C", and "D", respectively, two control input terminals labelled "S1" and "S0", and an output terminal labelled "Q". Each multiplexer cell in multiplexer 201 receives signal C1 at the S1 input terminal and signal C0 at the S0 input terminal. Multiplexer cell 230 has A, B, and C input terminals each receiving signal $\overline{\text{SIGN EXTEND}}$, a D input terminal receiving signal I21, and an output terminal for providing a signal labelled "MUX24". Multiplexer cell 231 has A and B input terminals each receiving signal $\overline{\text{SIGN EXTEND}}$, a C input terminal for receiving signal I21, a D input terminal receiving signal I20, and an output terminal for providing a signal labelled "MUX23". This pattern continues for nineteen multiplexer cells (not shown). The four multiplexer cells in the less-significant bit positions begin to receive $V_{SS}$ at inputs thereof. Multiplexer cell 232 has an A input terminal for receiving signal I3, a B input terminal for receiving signal I2, a C input terminal for receiving signal I1, a D input terminal for receiving signal I0, and an output terminal for providing a signal labelled "MUX3". Multiplexer cell 233 has an A input terminal for receiving signal I2, a B input terminal for receiving signal I1, a C input terminal for receiving signal I0, a D input terminal connected to $V_{SS}$, and an output terminal for providing a signal labelled "MUX2". Multiplexer cell 234 has an A input terminal for receiving signal I1, a B input terminal for receiving signal I0, C and D input terminals connected to $V_{SS}$, and an output terminal for providing a signal labelled "MUX1". Multiplexer cell 235 has an A input terminal for receiving signal I0, B, C and D input terminals connected to $V_{SS}$, and an output terminal for providing a signal labelled "MUX0".

FIG. 13 illustrates in block diagram form integrator 202 of FIG. 10. Summing device 205 of integrator 202 includes twenty-eight full adders including illustrative full adders 240-245. Full adder 240 has an A input terminal for receiving signal $\overline{\text{SIGN EXTEND}}$, a B input terminal, a CI input terminal, an S output terminal, and a CO output terminal. Full adder 241 has an A input terminal for receiving signal $\overline{\text{SIGN EXTEND}}$, a B input terminal, a CI input terminal, an S output terminal, and a CO output terminal connected to the CI input terminal of full adder 240. Full adder 242 has an A input terminal for receiving signal $\overline{\text{SIGN EXTEND}}$, a B input terminal, a CI input terminal, an S output terminal, and a CO output terminal connected to the CI input terminal of full adder 241. Full adder 243 has an A input terminal for receiving signal MUX24, a B input terminal, a CI input terminal, an S output terminal, and a CO output terminal connected to the CI input terminal of full adder 242. The connections of seventeen full adders between full adder 243 and full adder 244 is the same as for full adder 243. Full adder 244 has an A input terminal for receiving signal MUX6, a B input terminal, a CI input terminal, an S output terminal, and a CO output terminal connected to the CI input terminal of a previous full adder (not shown). Between full adder 244 and full adder 245 are five full adders with corresponding connections. Full adder 245 has an A input terminal for receiving signal MUX0, a B input terminal, a CI input terminal connected to $V_{SS}$, an S output terminal, and a CO output terminal connected to the CI input terminal of a previous full adder (not shown).

Register 206 of integrator 202 includes twenty-eight D flip-flops including illustrative D flip-flops 250-255. Flip-flop 250 has a D input terminal connected to the S output terminal of full adder 240, an R input terminal for receiving signal RESET, a clock input terminal for receiving signal ICLK, and a Q output terminal for providing signal DO21 and connected to the B input terminal of full adder 240. Flip-flop 251 has a D input terminal connected to the S output terminal of full adder 241, an R input terminal for receiving signal RESET, a clock input terminal for receiving signal ICLK, and a Q output terminal for providing signal DO20 and connected to the B input terminal of full adder 241. Flip-flop 252 has a D input terminal connected to the S output terminal of full adder 242, an R input terminal for receiving signal RESET, a clock input terminal for receiving signal ICLK, and a Q output terminal for providing signal DO19 and connected to the B input terminal of full adder 242. Flip-flop 253 has a D input terminal connected to the S output terminal of full adder 243, an R input terminal for receiving signal RESET, a clock input terminal for receiving signal ICLK, and a Q output terminal for providing signal DO18 and connected to the B input terminal of full adder 243. Between flip-flop 253 and 254 are seventeen flip flops not shown with corresponding connections. Flip-flop 254 has a D input terminal connected to the S output terminal of full adder 244, an R input terminal for receiving signal RESET, a clock input terminal for receiving signal ICLK, and a Q output terminal for providing signal DO0 and connected to the B input terminal of full adder 244. Between flip-flop 254 and flip-flop 255 are five flip-flops, not shown, with connections corresponding to flip-flop 255. Flip-flop 254 has a D input terminal connected to the S output terminal of full adder 245, an R input terminal for receiving signal RESET, a clock input terminal for receiving signal ICLK, and a Q output terminal connected to the B input terminal of full adder 245.

Figure 14:
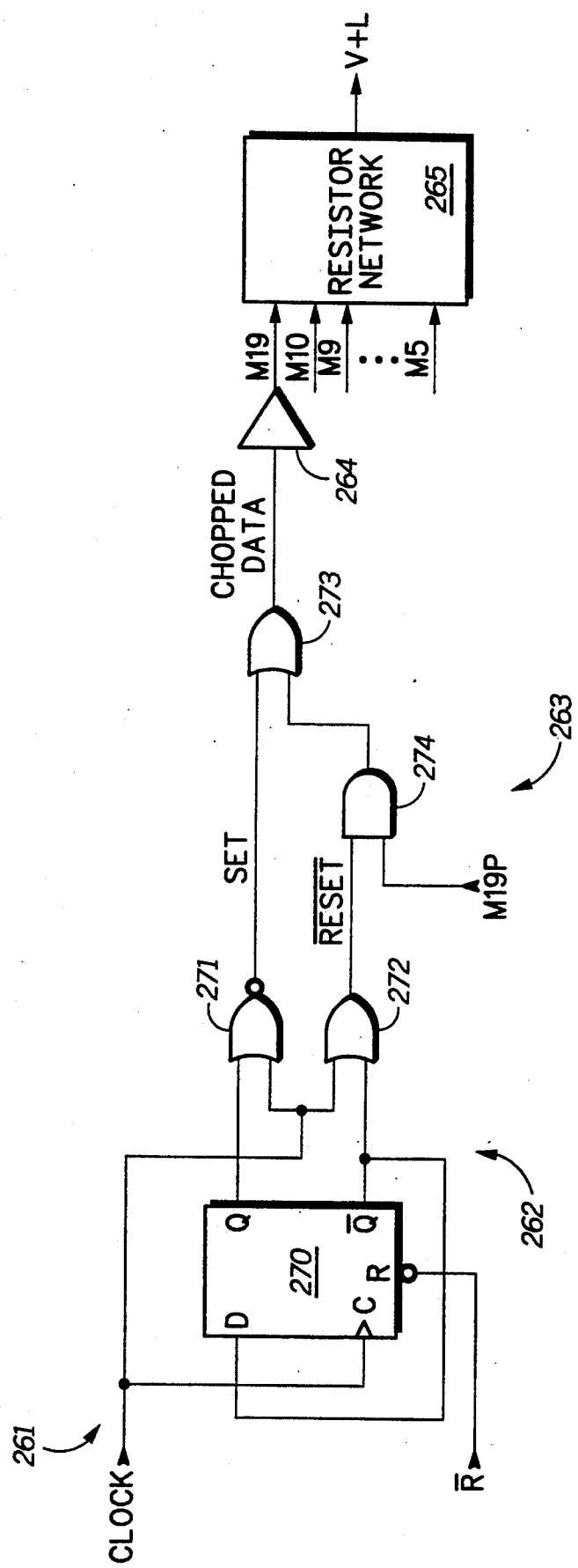
FIG. 14 conceptually illustrates in partial block diagram form and partial logic diagram form a portion of the analog summing network of FIG. 1 including a chop circuit.

FIG. 14 conceptually illustrates in partial block diagram form and partial logic diagram form a portion 260 of analog summing network 26 of FIG. 1 including a chop circuit 261. Chop circuit 261 includes generally a set and reset generator 262 and a logic portion 263. Set and reset generator 262 includes a counter implemented as a D flip-flop 270, a NOR gate 271, and an OR gate 272. Flip-flop 270 has a D input terminal, a C or clock input terminal for receiving a clock signal labelled "CLOCK", an active-low reset input terminal labelled "R", for receiving a signal labelled "$\overline{R}$", a Q output terminal, and a $\overline{Q}$ output terminal connected to the D input terminal. CLOCK is a buffered version of signal CLKIN, and is the same clock as that used for sigma-delta modulator 25. $\overline{R}$ is a reset pulse generated from a corresponding input signal as illustrated in FIG. 1. NOR gate 271 has a first input terminal connected to the Q output terminal of flip-flop 270, a second input terminal for receiving signal CLOCK, and an output terminal for providing a signal labelled "SET". OR gate 272 has a first input terminal for receiving signal CLOCK, a second input terminal connected to the $\overline{Q}$ output terminal of flip-flop 270, and an output terminal for providing a signal labelled "$\overline{RESET}$". Chop circuit 261 signal $\overline{RESET}$ is to be distinguished from input signal $\overline{RESET}$ of FIG. 1 and the internal signal corresponding to input signal $\overline{RESET}$ here designated as $\overline{R}$.

Sigma-delta modulator 25 provides seven output signals labelled M19, M10, M9, M8, M7, M6, and M5, as discussed above. A portion of analog summing network 26 not shown receives the seven output signals of modulator 25 and provides two signals corresponding to each of the seven output signals, one for developing the positive differential output signal, and the other for developing the negative differential output signal. One signal labelled "M19P", and used for developing the positive differential signal corresponding to signal M19, is illustrated in FIG. 14. Analog summing network 260 also includes chop circuits (not shown) similar to chop circuit 261 receiving signals for developing the positive and negative output signals corresponding to the remaining output signals.

Logic portion 263 includes an OR gate 273, and an AND gate 274. OR gate 273 has a first input terminal for receiving signal SET, a second input terminal, and an output terminal for providing a signal labelled "CHOPPED DATA". AND gate 274 has a first input terminal for receiving signal $\overline{RESET}$, a second input terminal for receiving signal M19P, and an output terminal connected to the second input terminal of OR gate 273. In the illustrated embodiment, OR gate 273 and AND gate 274 are implemented as a "two-stack", in which both functions are included in a single logic gate.

Portion 260 also includes an output buffer 264 having an input terminal for receiving signal CHOPPED DATA, and an output terminal for providing signal M19. While the same signal designation is used here as previously for sigma-delta modulator 25, they are different signals. Portion 260 further includes a resistor network 265, which has an input terminal for receiving signal M19, and six other input terminals respectively receiving the buffered, chopped signals of sigma-delta modulator 25. Resistor network 265 weights each signal proportionally to its significance, and provides output signal V+L in response.

D flip-flop 270 functions as a two-bit counter, effectively dividing signal CLOCK is half. NOR gate 271 and OR gate 272 together provide the SET and $\overline{RESET}$ signals during non-overlapping one-fourths of the period of the output of counter (D flip-flop) 270. During two sequential periods of signal CLOCK, signal SET is active at a logic high for one-half of a clock cycle, and signal $\overline{RESET}$ is active at a logic low for one-half of the succeeding clock cycle. Logic portion 263 receives signal M19P and alternately inserts the logic high of signal SET and the logic low of signal $\overline{RESET}$ into signal M19P to provide signal CHOPPED DATA. Note that analog summing network 26 includes control circuitry (not shown) which enables the chop mode and the differential outputs respectively in response to signals ACHOP and DIFF.

Output buffer 264 is a CMOS output buffer, with three stages of conventional CMOS inverters (not shown), each including a P-channel and an N-channel transistor connected between $V_{DD}$ and $V_{SS}$. Because the transfer characteristics of P-channel and N-channel transistors are somewhat different, each inverter stage produces a different delay on one transition than on the other transition. This characteristic produces even-order distortion. Since N-type silicon has a higher conductance than P-type silicon, the N-channel transistor will switch faster than a similarly-sized P-channel transistor. Thus, when presented with a square wave at its input, the inverter will provide an output that has longer low pulses than high pulses. This results in an even-order distortion (of which the DC offset is an order of zero in a Fourier expansion). While it is possible to alter the sizes of the devices to compensate for the difference in the switching speeds, the compensation will be inexact as temperature, voltage, and processing parameters vary. Thus, the distortion remains.

DAC 20 allows some cancellation for the even-order distortion problem by providing differential outputs. The differential outputs can be processed through separate smoothing filters and provided as inputs to a differential amplifier, all located off-chip. Since the distortion occurs in opposite directions between the true and complement output signals, the differential amplifier is able to cancel them out. However, this cancellation is not perfect, and is limited to the matching of the components in the smoothing filter and the amplifier. In addition, some applications use only the single-ended output signal, so even this limited cancellation is not available.

DAC 20 eliminates the even-order distortion by including chop circuit 261 and similar chop circuits for the output signals of sigma-delta modulator 25 (not shown) to chop the data before providing it to output buffer 264 and resistor network 265. Over two periods of CLOCK, chop circuit 261 ensures that output buffer 264 switches and does not allow long periods of ones or zeros. The SET and $\overline{RESET}$ signals guarantee exactly one low-to-high transition and exactly one high-to-low transition of CHOPPED DATA every two CLOCK periods. Thus, the SET and $\overline{RESET}$ insertions have an average of zero over the two-CLOCK period. Chop circuit 261 results in a 6 dB attenuation, which can be compensated for off-chip, if desired. The 6 dB attenuation is sensitive to the duty cycle of CLOCK, and increases to 12 dB, for example, with a 25/75 duty cycle. Thus, in applications in which a single-ended output is used, a precise fifty-percent duty cycle CLOCK signal is preferred. In applications in which a differential output is used, chop circuit 261 in conjunction with differential outputs make the attenuation independent of CLOCK duty cycle. In this way, the even-order distortion can be eliminated instead of being reduced by a factor dependent on the component matching.

Figure 15:
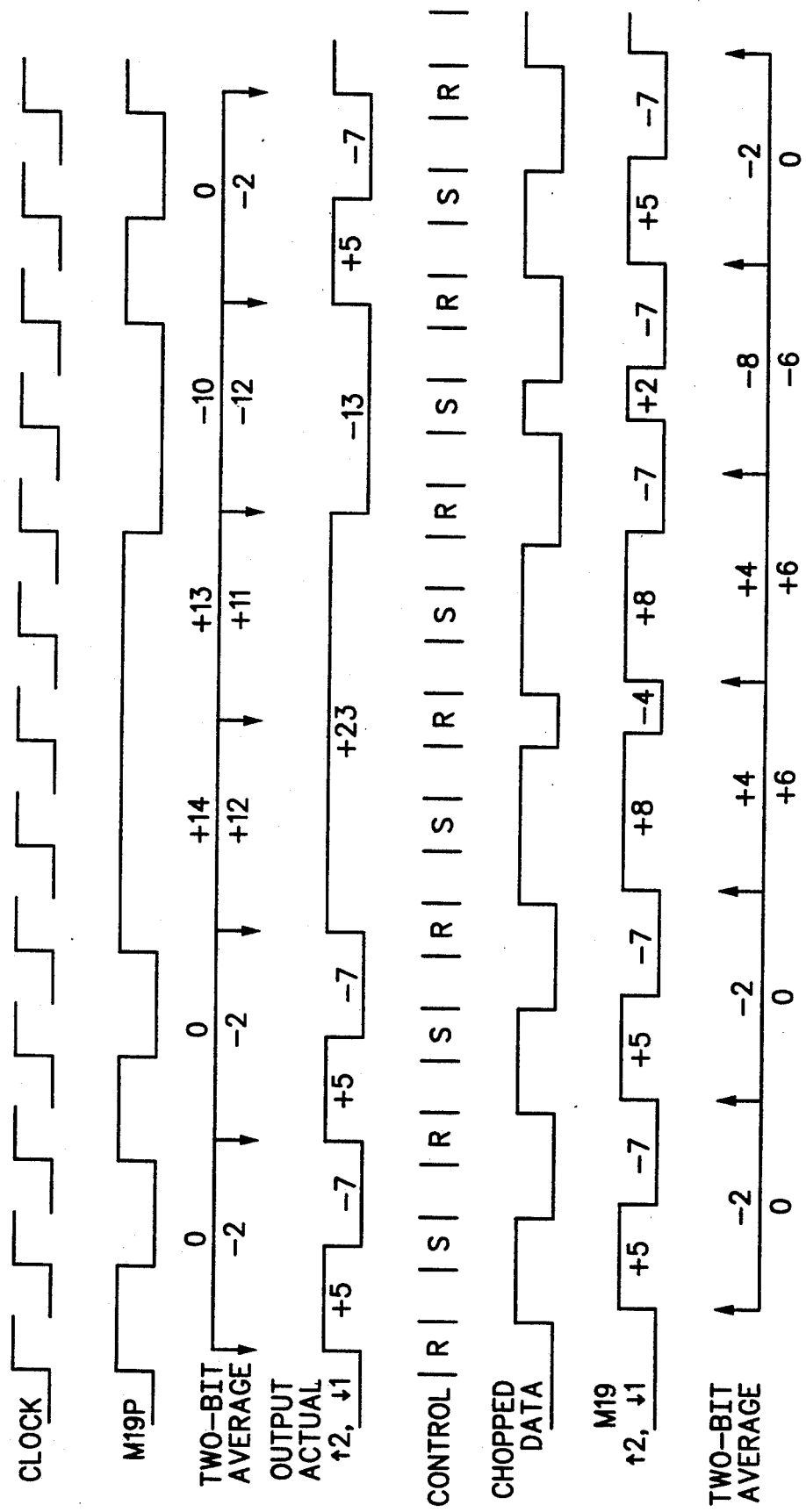
FIG. 15 illustrates a timing diagram useful in understanding the chop circuit of FIG. 14.

FIG. 15 illustrates a timing diagram useful in understanding the chop circuit of FIG. 14. A fifty-percent duty cycle CLOCK signal is shown, along with an illustrative sequence of signal M19P. A signal stream labelled "ACTUAL OUTPUT" represents signal M19 at the output of output buffer 264 if chop circuit 261 were disabled. In this case, it is assumed that the P-channel/N-channel transistor mismatch results in a rise time which is twice as long as a corresponding fall time. Thus, the numbers such as +5, −7, etc. represent being at a logic high for a relative time of 5, being at a logic low a relative time of 7, etc., where a period of CLOCK has a relative time of 6. Corresponding to the ACTUAL OUTPUT signal stream is a "TWO-BIT AVERAGE" stream which has a bottom number corresponding to a two-CLOCK period average of ACTUAL OUTPUT. For example, in the first two-CLOCK period, DATA is has a fifty percent duty cycle, which would generate a two-CLOCK average of zero. However, the rise and fall-time mismatch of output buffer 264 causes a two-bit average of −2. Removing this DC error, as shown in the top number, shows that the ACTUAL OUTPUT has an output dependent on the number of consecutive one and zero pulses as well as the number of pulses alone. In other words, since output buffer 264 has a longer rise time than fall time, a fifty-percent duty cycle input signal results in an output signal with a longer logic low time. This longer logic low time has a negative DC offset, indicating even-order distortion.

However, chop circuit 261 alternately inserts SET and $\overline{\text{RESET}}$ pulses, which is illustrated as a stream of alternate "S" and "R" signals labelled "CONTROL". CHOPPED DATA and M19 are represented subsequently. A signal stream labelled "TWO BIT AVERAGE" associated with signal stream M19 has a top number corresponding to a two-CLOCK period average of M19, and a bottom number corresponding to a two-CLOCK period average of M19 which eliminated the DC offset of −2. Note that the sum of the TWO-BIT AVERAGE of input signal M19P over the time period illustrated in FIG. 15 is +12, while the sum of the TWO-BIT AVERAGE of M19 after eliminating the DC offset is +6, which is a one-half (6 dB) attenuation.

Figure 16:
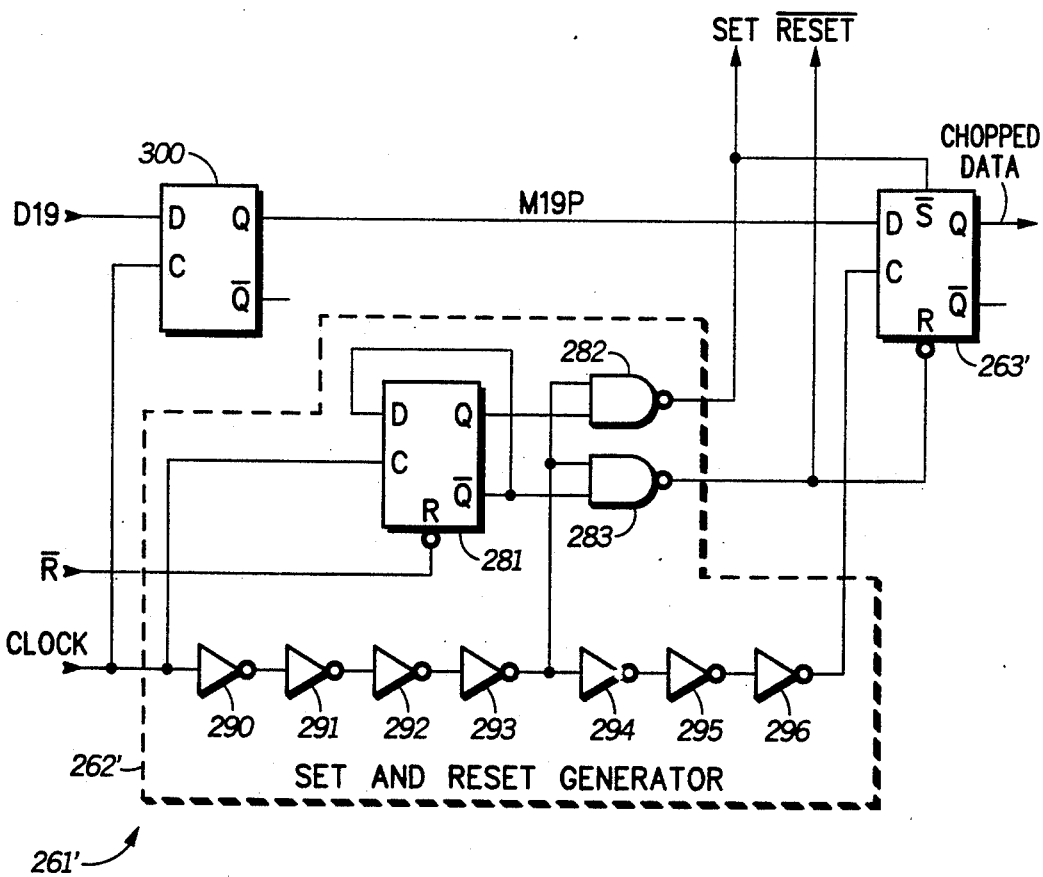
FIG. 16 illustrates in partial block diagram form and partial logic diagram form a chop circuit in accordance with a preferred embodiment of the present invention.

FIG. 16 illustrates in partial block diagram form and partial logic diagram form a chop circuit 261' in accordance with a preferred embodiment of the present invention. As before, chop circuit 261' includes a set and reset generator 262' and a logic portion 263'. Set and reset generator 262' includes a D flip-flop 281, NAND gates 282 and 283, and inverters 290–296. D flip-flop 281 has a D input terminal, a C input terminal for receiving signal CLOCK, an active-low R input terminal for receiving signal $\overline{R}$, a Q output terminal, and a $\overline{Q}$ output terminal connected to the D input terminal thereof. NAND gate 282 has a first input terminal, a second input terminal connected to the Q output terminal of NAND gate 282, and an output terminal for providing signal SET. NAND gate 283 has a first input terminal connected to the first input terminal of NAND gate 282, a second input terminal connected to the $\overline{Q}$ output terminal of flip-flop 281, and an output terminal for providing signal $\overline{\text{RESET}}$. Inverters 290–296 are series-connected in a string with an input terminal of inverter 290 providing an input terminal of the string and receiving signal CLOCK, an output terminal of inverter 293 connected to the first input terminals of NAND gates 282 and 283, and an output terminal of inverter 296 providing an output terminal of the string. Note that set and reset generator 262' is common to several chop circuits.

In chop circuit 261', logic portion 263' is implemented as a single D flip-flop also designated 263'. Flip-flop 263' has a D input terminal for receiving signal M19P, a C input terminal connected to the output terminal of the string of inverters, an active-low R input terminal for receiving signal $\overline{\text{RESET}}$, an active low set terminal designated $\overline{S}$ for receiving signal SET, a Q output terminal for providing signal CHOPPED DATA. FIG. 16 also illustrates a D flip-flop 300 which is a part of sigma-delta modulator 25 of FIG. 1 having a D input terminal for receiving a data bit associated with the high-order modulator output bit labelled "D19", a C input terminal for receiving signal CLOCK, and a Q output terminal for providing signal M19P.

While chop circuit 261 is useful in understanding the operation of DAC 20, there are problems for some gate delay times. Chop circuit 261' reclocks CHOPPED DATA and is thus insensitive to gate delay times, and is thus preferred. Chop circuit 261 of FIG. 14 may be used in other embodiments if gate delay times are closely managed.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A sigma-delta digital-to-analog converter with reduced distortion, comprising:
   a sigma-delta modulator having an input for receiving a digital input signal, and an output for providing a modulator output signal at a rate of a clock signal, said modulator output signal having a duty cycle proportional to a magnitude of said digital input signal;
   a chop circuit coupled to said sigma-delta modulator, for receiving said modulator output signal and for alternately inserting first and second logic levels into said modulator output signal to provide a chopped data signal; and
   an output buffer having an input for receiving said chopped data signal, and an output for providing a buffered chopped data signal.

2. The sigma-delta digital-to-analog converter of claim 1 wherein said chop circuit inserts said first and second logic states alternately during sets of two periods of said clock signal.

3. The sigma-delta digital-to-analog converter of claim 1 wherein said output buffer is characterized as being a CMOS output buffer.

4. The sigma-delta digital-to-analog converter of claim 1 wherein said chop circuit comprises:
   means for activating set and reset pulses respectively during first and second portions of said clock signal, said set pulse and said reset pulse nonoverlapping and each having a duty cycle less than fifty percent; and means coupled to said activating means, for providing said chopped data signal as either said first logic level, said second logic level, or said modulator output signal, respectively in response to said set pulse being active, to said reset pulse being active, or to both said set and reset signals being inactive.

5. The sigma-delta digital-to-analog converter of claim 4 wherein said providing means comprises:
a counter for receiving said clock signal, and for providing true and complementary output signals at a frequency determined by a predetermined number of pulses of said clock signal;
first logic means coupled to said counter, for providing said set pulse in response to both said clock signal and true output signal being in a first logic state; and
second logic means coupled to said counter for providing said reset pulse in response to both said clock signal and said complementary output signal being in a second logic state.

6. The sigma-delta digital-to-analog converter of claim 5 wherein said counter comprises a D flip-flop having a D input terminal, a clock input terminal for receiving said clock signal, a true output terminal for providing said true output signal, and a complementary output terminal for providing said complementary output signal and coupled to said D input terminal thereof.

7. The sigma-delta digital-to-analog converter of claim 5 wherein said first logic means comprises a NOR gate having a first input terminal for receiving said true output signal, a second input terminal for receiving said clock signal, and an output terminal for providing said set signal.

8. The sigma-delta digital-to-analog converter of claim 5 wherein said second logic means comprises an OR gate having a first input terminal for receiving said clock signal, a second input terminal for receiving said complementary output signal, and an output terminal for providing said reset signal.

9. The sigma-delta digital-to-analog converter of claim 4 wherein said providing means comprises:
an AND gate having a first input terminal for receiving said reset signal, a second input terminal for receiving said modulator output signal, and an output terminal; and
an OR gate having a first input terminal for receiving said set pulse, a second input terminal coupled to said output terminal of said AND gate, and an output terminal for providing said chopped data signal.

10. A sigma-delta digital-to-analog converter with reduced distortion, comprising:
a sigma-delta modulator having an input for receiving a digital input signal, and an output for providing a modulator output signal at a rate of a clock signal, said modulator output signal having a duty cycle proportional to a magnitude of said digital input signal;
means for activating set and reset pulses respectively during first and second portions of said clock signal, said set pulse and said reset pulse nonoverlapping and each having a duty cycle less than fifty percent;
means coupled to said activating means, for providing a chopped data signal as either a logic high, a logic low, or said modulator output signal, respectively in response to said set pulse being active, to said reset pulse being active, or to both said set and reset signals being inactive; and
an output buffer having an input coupled to said providing means, and an output for providing an output signal.

11. The sigma-delta digital-to-analog converter of claim 10 wherein said providing means comprises:
a counter for receiving said clock signal, and for providing true and complementary output signals at a frequency determined by a predetermined number of pulses of said clock signal;
first logic means coupled to said counter, for providing said set pulse in response to both said clock signal and true output signal being in a first logic state; and
second logic means coupled to said counter for providing said reset pulse in response to both said clock signal and said complementary output signal being in a second logic state.

12. The sigma-delta digital-to-analog converter of claim 11 wherein said counter comprises a D flip-flop having a D input terminal, a clock input terminal for receiving said clock signal, a true output terminal for providing said true output signal, and a complementary output terminal for providing said complementary output signal and coupled to said D input terminal thereof.

13. The sigma-delta digital-to-analog converter of claim 11 wherein said first logic means comprises a NOR gate having a first input terminal for receiving said true output signal, a second input terminal for receiving said clock signal, and an output terminal for providing said set signal.

14. The sigma-delta digital-to-analog converter of claim 11 wherein said second logic means comprises an OR gate having a first input terminal for receiving said clock signal, a second input terminal for receiving said complementary output signal, and an output terminal for providing said reset signal.

15. The sigma-delta digital-to-analog converter of claim 10 wherein said providing means comprises:
an AND gate having a first input terminal for receiving said reset signal, a second input terminal for receiving said modulator output signal, and an output terminal; and
an OR gate having a first input terminal for receiving said set pulse, a second input terminal coupled to said output terminal of said AND gate, and an output terminal for providing said chopped data signal.

16. The sigma-delta digital-to-analog converter of claim 10 wherein said output buffer is characterized as being a CMOS output buffer.

17. A sigma-delta digital-to-analog converter with reduced distortion, comprising:
a sigma-delta modulator having an input for receiving a digital signal, and an output for providing a plurality of output signals at a predetermined clock rate;
a plurality of chop circuits, each chop circuit receiving a predetermined one of said plurality of output signals of said sigma-delta modulator, and providing a corresponding chopped data signal;
a plurality of output buffers corresponding to said plurality of chop circuits each having an input for receiving a corresponding chopped data signal, and an output for providing a corresponding buffered chopped data signal; and a resistor network having inputs for receiving respective ones of said buffered chopped data signals, and an output for providing a weighted output signal;

each of said plurality of chop circuits comprising:

means for activating set and reset pulses respectively during first and second portions of said clock signal, said set pulse and said reset pulse nonoverlapping and each having a duty cycle less than fifty percent;

means coupled to said activating means, for providing a chopped data signal as either a logic high, a logic low, or said modulator output signal, respectively in response to said set pulse being active, to said reset pulse being active, or to both said set and reset signals being inactive.

18. The sigma-delta digital-to-analog converter of claim 17 wherein each of said plurality of output buffers is characterized as being a CMOS output buffer.

19. The sigma-delta digital-to-analog converter of claim 17 wherein said resistor network weights each of said buffered chopped data signals proportional to a significance of a corresponding output signal of said sigma-delta modulator.

20. A sigma-delta digital-to-analog converter with reduced distortion, comprising:

a sigma-delta modulator having an input for receiving a digital input signal, and an output for providing at least one modulator output signal at a rate of a clock signal, said modulator output signal having a duty cycle proportional to a magnitude of said digital input signal;

a first chop circuit coupled to said sigma-delta modulator, for receiving a true modulator output signal of said at least one modulator output signal and for alternately inserting first and second logic levels into said true modulator output signal to provide a true chopped data signal;

a first output buffer having an input for receiving said true chopped data signal, and an output for providing a true buffered chopped output signal;

a second chop circuit coupled to said sigma-delta modulator, for receiving a complement modulator output signal of said at least one modulator output signal and for alternately inserting said second and said first logic levels into said complement of said modulator output signal to provide a complement chopped data signal; and a second output buffer having an input for receiving said complement chopped data signal, and an output for providing a complement buffered chopped output signal.

* * * * *